United States Patent
Kholodenko et al.

(10) Patent No.: US 7,572,334 B2
(45) Date of Patent: Aug. 11, 2009

(54) APPARATUS FOR FABRICATING LARGE-SURFACE AREA POLYCRYSTALLINE SILICON SHEETS FOR SOLAR CELL APPLICATION

(75) Inventors: Arnold V. Kholodenko, San Francisco, CA (US); Robert Z. Bachrach, Burlingame, CA (US); Mark Mandelboym, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 11/325,089

(22) Filed: Jan. 3, 2006

(65) Prior Publication Data

US 2007/0158654 A1 Jul. 12, 2007

(51) Int. Cl.
*C30B 11/00* (2006.01)
*B05C 11/00* (2006.01)

(52) U.S. Cl. ............... 117/200; 117/211; 117/217; 118/58; 118/300

(58) Field of Classification Search ......... 117/200–220; 118/58, 300, 302, 407, 410, 429
See application file for complete search history.

(56) References Cited

U.S. PATENT DOCUMENTS

| | | | |
|---|---|---|---|
| 2,841,860 A * | 7/1958 | Koury | 438/460 |
| 2,900,708 A * | 8/1959 | Pond | 428/607 |
| 3,898,051 A | 8/1975 | Schmid | |
| 4,003,770 A | 1/1977 | Janowiecki et al. | |
| 4,036,666 A * | 7/1977 | Mlavsky | 438/68 |
| 4,056,404 A * | 11/1977 | Garone et al. | 136/255 |
| 4,092,972 A | 6/1978 | Schmid | |
| 4,112,135 A | 9/1978 | Heaps et al. | |
| 4,121,965 A | 10/1978 | Leipold et al. | |
| 4,137,355 A | 1/1979 | Heaps et al. | |
| 4,163,678 A | 8/1979 | Frosch et al. | |
| 4,178,670 A | 12/1979 | Schmid | |
| 4,187,828 A | 2/1980 | Schmid | |
| 4,211,496 A | 7/1980 | Naylor | |

(Continued)

FOREIGN PATENT DOCUMENTS

EP         A 0072565          2/1983

(Continued)

OTHER PUBLICATIONS

PCT International Search Report and Written Opinion dated Jun. 11, 2008 for International Application No. PCT/US2006/62471 (APPM/010241-PCT).

(Continued)

*Primary Examiner*—Robert M Kunemund
*Assistant Examiner*—G. Nagesh Rao
(74) *Attorney, Agent, or Firm*—Psatterson & Sheridan LLP

(57) ABSTRACT

A method and apparatus for forming a semiconductor sheet suitable for use as a solar cell by depositing an array of solidified drops of a feed material on a sheet support. The desired properties of the sheet fabricated with the teaching of this invention are: flatness, low residual stress, minority carrier diffusion length greater than 40 microns, and minimum grain dimension at least two times the minority carrier diffusion length. In one embodiment, the deposition chamber is adapted to form and process sheets that have a surface area of about 1,000-2,400 cm$^2$.

3 Claims, 17 Drawing Sheets

U.S. PATENT DOCUMENTS

| | | |
|---|---|---|
| 4,218,418 A | 8/1980 | Schmid et al. |
| 4,226,834 A * | 10/1980 | Shudo et al. ............... 117/217 |
| 4,229,231 A * | 10/1980 | Witt et al. ..................... 438/2 |
| 4,235,644 A | 11/1980 | Needes |
| 4,251,570 A | 2/1981 | Zook |
| 4,252,861 A | 2/1981 | Heaps et al. |
| 4,256,079 A | 3/1981 | Schmid |
| 4,256,530 A | 3/1981 | Schmid et al. |
| 4,264,407 A * | 4/1981 | Shudo et al. ................. 117/30 |
| 4,285,386 A * | 8/1981 | Narasimhan ............... 164/463 |
| 4,287,869 A | 9/1981 | Schmid |
| 4,292,344 A | 9/1981 | McHale |
| 4,292,487 A | 9/1981 | Leon |
| 4,316,764 A * | 2/1982 | Kudo et al. .................. 117/30 |
| 4,341,589 A * | 7/1982 | Grabmaier .................. 117/73 |
| 4,347,262 A | 8/1982 | Marcus |
| 4,349,178 A | 9/1982 | Schmid |
| 4,357,201 A | 11/1982 | Grabmaier et al. |
| 4,375,007 A | 2/1983 | Marcus |
| 4,379,777 A | 4/1983 | Boulos |
| 4,383,130 A | 5/1983 | Uroshevich |
| 4,384,564 A | 5/1983 | Smith et al. |
| 4,390,743 A | 6/1983 | Dahlberg |
| 4,408,653 A * | 10/1983 | Nienart et al. ............. 164/463 |
| 4,447,289 A | 5/1984 | Geissler et al. |
| 4,481,235 A | 11/1984 | Foell et al. |
| 4,523,966 A * | 6/1985 | Tsuya et al. ................ 438/490 |
| 4,578,144 A | 3/1986 | Hiramoto |
| 4,594,229 A | 6/1986 | Ciszek et al. |
| 4,599,132 A | 7/1986 | Jewett et al. |
| 4,602,422 A | 7/1986 | Dinh |
| 4,619,845 A | 10/1986 | Ayers et al. |
| 4,627,887 A | 12/1986 | Sachs et al. |
| 4,638,110 A | 1/1987 | Erbert |
| 4,643,797 A | 2/1987 | Grabmaier et al. |
| 4,646,710 A | 3/1987 | Schmid et al. |
| 4,661,200 A | 4/1987 | Sachs |
| 4,677,250 A | 6/1987 | Barnett et al. |
| 4,684,513 A | 8/1987 | Iya |
| 4,689,109 A | 8/1987 | Sachs |
| 4,690,797 A | 9/1987 | Eyer et al. |
| 4,727,852 A | 3/1988 | Schmid et al. |
| 4,749,438 A | 6/1988 | Bleil |
| 4,772,564 A | 9/1988 | Barnett et al. |
| 4,775,443 A | 10/1988 | Bleil |
| 4,781,766 A | 11/1988 | Barnett et al. |
| 4,790,871 A | 12/1988 | Schwirtlich et al. |
| 4,842,462 A | 6/1989 | Tildesley |
| 4,861,416 A | 8/1989 | Morrison |
| 4,873,063 A | 10/1989 | Bleil |
| 5,055,157 A | 10/1991 | Bleil |
| 5,057,163 A | 10/1991 | Barnett et al. |
| 5,064,497 A | 11/1991 | Clemans et al. |
| 5,069,742 A | 12/1991 | Bleil |
| 5,106,763 A * | 4/1992 | Bathey et al. ................. 438/62 |
| 5,133,829 A | 7/1992 | Geyling |
| 5,182,091 A | 1/1993 | Yuge et al. |
| 5,229,083 A * | 7/1993 | Bleil .......................... 117/202 |
| 5,266,125 A | 11/1993 | Rand et al. |
| 5,298,109 A | 3/1994 | Knauth et al. |
| 5,336,335 A | 8/1994 | Hall et al. |
| 5,356,509 A | 10/1994 | Terranova et al. |
| 5,394,825 A | 3/1995 | Schmid et al. |
| 5,428,249 A | 6/1995 | Sawayama et al. |
| 5,431,869 A | 7/1995 | Kumar et al. |
| 5,438,973 A | 8/1995 | Schmid et al. |
| 5,496,416 A | 3/1996 | Hall et al. |
| 5,496,446 A | 3/1996 | Yeoman et al. |
| 5,520,371 A | 5/1996 | Miller et al. |
| 5,556,791 A | 9/1996 | Stevens et al. |
| 5,614,020 A | 3/1997 | Stevens et al. |
| 5,620,904 A | 4/1997 | Hanoka |
| 5,659,133 A | 8/1997 | Sims et al. |
| 5,661,041 A | 8/1997 | Kano |
| 5,741,370 A | 4/1998 | Hanoka |
| 5,762,720 A | 6/1998 | Hanoka et al. |
| 5,800,611 A | 9/1998 | Christensen |
| 5,828,088 A | 10/1998 | Mauk |
| RE36,156 E | 3/1999 | Hall et al. |
| 5,968,601 A | 10/1999 | Leon et al. |
| 5,972,107 A | 10/1999 | Schmid et al. |
| 5,973,259 A | 10/1999 | Edelson |
| 5,986,203 A | 11/1999 | Hanoka et al. |
| 6,019,841 A | 2/2000 | Jafri et al. |
| 6,067,728 A | 5/2000 | Farmer et al. |
| 6,090,199 A | 7/2000 | Wallace et al. |
| 6,111,191 A | 8/2000 | Hall et al. |
| 6,111,276 A | 8/2000 | Mauk |
| 6,113,473 A | 9/2000 | Costantini et al. |
| 6,114,046 A | 9/2000 | Hanoka |
| 6,146,483 A | 11/2000 | Hanoka et al. |
| 6,165,425 A | 12/2000 | Lange et al. |
| 6,187,448 B1 | 2/2001 | Hanoka |
| 6,200,383 B1 | 3/2001 | Wallace et al. |
| 6,206,996 B1 | 3/2001 | Hanoka et al. |
| 6,207,891 B1 | 3/2001 | Hall et al. |
| 6,211,455 B1 | 4/2001 | Ford et al. |
| 6,214,636 B1 | 4/2001 | Sawayama et al. |
| 6,214,733 B1 | 4/2001 | Sickmiller |
| 6,217,649 B1 | 4/2001 | Wallace et al. |
| 6,245,630 B1 | 6/2001 | Ishikawa |
| 6,258,166 B1 * | 7/2001 | Leon et al. .................. 118/324 |
| 6,278,053 B1 | 8/2001 | Hanoka et al. |
| 6,284,312 B1 | 9/2001 | Chandra et al. |
| 6,320,116 B1 | 11/2001 | Hanoka |
| 6,353,042 B1 | 3/2002 | Hanoka et al. |
| 6,355,875 B1 | 3/2002 | Kamimura |
| 6,362,021 B2 | 3/2002 | Ford et al. |
| 6,365,225 B1 | 4/2002 | Chandra et al. |
| 6,368,403 B1 | 4/2002 | Schmid et al. |
| 6,413,313 B1 | 7/2002 | Yoshida et al. |
| 6,414,237 B1 | 7/2002 | Böer |
| 6,418,921 B1 | 7/2002 | Schmid et al. |
| 6,420,643 B2 | 7/2002 | Ford et al. |
| 6,479,108 B2 | 11/2002 | Hariharan et al. |
| 6,479,316 B1 | 11/2002 | Hanoka et al. |
| 6,491,971 B2 | 12/2002 | Costantini et al. |
| 6,514,342 B2 | 2/2003 | Kozarek et al. |
| 6,521,827 B2 | 2/2003 | Tsukuda et al. |
| 6,562,132 B2 * | 5/2003 | Mackintosh et al. ........ 117/209 |
| 6,581,415 B2 | 6/2003 | Chandra et al. |
| 6,586,271 B2 | 7/2003 | Hanoka |
| 6,596,075 B2 | 7/2003 | Igarishi et al. |
| 6,613,598 B1 | 9/2003 | Middleman |
| 6,620,645 B2 | 9/2003 | Chandra et al. |
| 6,632,413 B2 | 10/2003 | Clark et al. |
| 6,651,014 B2 | 11/2003 | Chandra et al. |
| 6,679,671 B2 | 1/2004 | Blonigan et al. |
| 6,841,728 B2 | 1/2005 | Jones et al. |
| 7,000,664 B2 * | 2/2006 | Kondoh ...................... 156/443 |
| 2001/0011554 A1 | 8/2001 | Ford et al. |
| 2001/0020446 A1 * | 9/2001 | Kozarek et al. ............. 118/300 |
| 2001/0020485 A1 | 9/2001 | Ford et al. |
| 2002/0021996 A1 | 2/2002 | Clark et al. |
| 2004/0000334 A1 | 1/2004 | Ressler |
| 2004/0003837 A1 | 1/2004 | Mauk |
| 2005/0000414 A1 | 1/2005 | Culik et al. |
| 2005/0001486 A1 | 1/2005 | Schripsema et al. |
| 2007/0158654 A1 * | 7/2007 | Kholodenko et al. .......... 257/65 |

FOREIGN PATENT DOCUMENTS

| | | |
|---|---|---|
| EP | A 0165449 | 12/1985 |
| EP | A 0170119 | 2/1986 |

| | | |
|---|---|---|
| EP | 1107320 A2 | 6/2001 |
| EP | 1113096 A1 | 7/2001 |
| EP | 1333111 A1 | 8/2003 |
| JP | 10-29895 | 1/1989 |
| JP | 2000-211996 | 8/2000 |
| JP | 2000-273310 | 10/2000 |
| JP | 2001-011996 | 1/2001 |
| JP | 2001-019595 | 1/2001 |
| JP | 2001-031496 | 2/2001 |
| JP | 2001-085344 | 3/2001 |
| JP | 2001-110733 | 4/2001 |
| JP | 2001-206798 | 7/2001 |
| JP | 2001-247396 | 9/2001 |
| JP | 2001-261322 | 9/2001 |
| JP | 2001-287908 | 10/2001 |
| JP | 2002-080295 | 3/2002 |
| JP | 2002-114597 | 4/2002 |
| JP | 2002-283044 | 10/2002 |
| JP | 2002-321908 | 11/2002 |
| JP | 2003-095630 | 4/2003 |
| JP | 2003-146640 | 5/2003 |
| JP | 2003-152201 | 5/2003 |
| JP | 2004-106394 | 4/2004 |
| JP | 2004-123433 | 4/2004 |
| JP | 2004-143006 | 5/2004 |
| JP | 2004-161583 | 6/2004 |
| JP | 2001-151505 | 6/2006 |

OTHER PUBLICATIONS

J. Rand, et al. "Silicon-Film™ Sheet, Solar Cell and Module Manufacturing" AstroPower, Inc. Newark, DE pp. 37-40.

I. Reis, et al. "Recrystallized Silicon Thin Film Structures for Solar Cells" Fraunhofer-Institut fUr Solare Energlesysteme, Freiburg F.R. G. 1998 pp. 1405-1408.

R.B. Hall, et al. "Monolithically Interconnected Silicon-Film™ Module Technology" National Renewable Energy Laboratory Annual Technical Report Nov. 25, 1997 thru Nov. 24, 1998 published Oct. 1999.

A. Gutjahr, et al. "Crystalline Silicon Growth on Silicon Nitride and Oxynitride Substrates for Thin Film Solar Cells"—16th European Photovoltaic Solar Energy Conference, Glasgow, United Kingdom—May 1-5, 2000 VD3.15 pp. 1-4.

A. Schönecker et al., "Ribbon-Growth-on-Substrate:Satus, Challenges, Promises of High Speed Silicon Wafer Manufacturing" 12th Workshop on Crystalline Silicon Solar Cells, Materials and Process—University of Konstanz, Germany.

A. Schönecker et al., "Casting Technologies for Solar Silicon Wafers: Block Casting and Ribbon-Growth-on Substrate"—ECN Energy Research Center of the Netherlands & Deutsche Solar AG Germany copyright by Trans Tech Publications.

G. H. Schwuttke et al., "Low Cost Silicon for Solar Energy Conversion Applications" IBM J. Res. Develop. vol. 22 • No. 4 Jul. 1978 pp. 335-345.

Daniel Harold Macdonald, "Recombination and Trapping in Multicrystalline Silicon Solar Cells" The Australian National University, May 2001, pp. 1-210.

Michelle J. McCann et al., "A Review of Thin Film Crystalline Silicon for Solar Cell Applications. Part 1: Native Substrates." Engineering Department., The Australian National University, pp. 1-39.

NREL National Renewable Energy Laboratory Research Brief "Growing a Better Crystal" produced by the Communications and MIS Branch for the Photovoltaic's Division Jan. 1996.

Solar—Technology to Today's Energy Needs, "Energy Conversion with Photovoltaics", Chapter X, Source Annual Operation Plan, Systems, Definition Project, 1978, pp. 313-426.

K. R. Catchpole, "A Review of Thin Film Silicon for Solar Cell Applications" Engineering Department, FEIT. The Australian National University, 4 pages.

G. Hahn et al. "New Crystalline Silicon Ribbon Materials for Photovoltaics", Journal of Physics, IOP Publishing Ltd. (2004) pp. R1615-R1648.

M Werner, et al., "Carbon in Multicrystalline Ribbon-Silicon for Solar Cell Application" Max-Planck Institute of Microstructure Physics, 4 pgs.

T. F. Ciszek, "Solid-Source Doping of Float-Zoned Silicon with B, N, O, and C", (NREL/Cp-520-34604), National Renewable Energy Laboratory, Aug. 10-13, 2003, pp. 1-4.

A.V. Shishkin, et al., "Parameters of Silicon Meniscus for a Product Pulling from Melt in a Direction of Gravity" International Scientific Colloquium, Modeling for Electromagnetic Processing Hannover, 03/24-26/03, 6 pgs.

O. Breitenstein et al., "EBIC investigation of a 3-Dimensional Network of Inversion Channels in Solar Cells on Silicon Ribbons" Halle, Germany.

Michael G. Mauk, Silicon Solar Cells: Physical Metallurgy Principles, JOM May 2003, pp. 38-42.

D. S. Ruby et al., "Research Needs of c-Si Technology Required to Meet Roadmap Milestones" Sandia National Laboratories, 2 pgs.

Martin Kittler, et al., Symposium E "Crystalline Silicon for Solar Cells", E-MRS, Solar Energy Material & Solar Cells, Jun. 5-8, 2001, 22 pgs.

Karl E. Knapp, Ph.D. et al., "An Empirical Perspective on the Energy Payback Time for Photovoltaic Modules", Solar 2000 Conference, Madison, Wisconsin, Jun. 16-21, 2000, Energy & Environmental Economics, Inc., pp. 1-6.

* cited by examiner

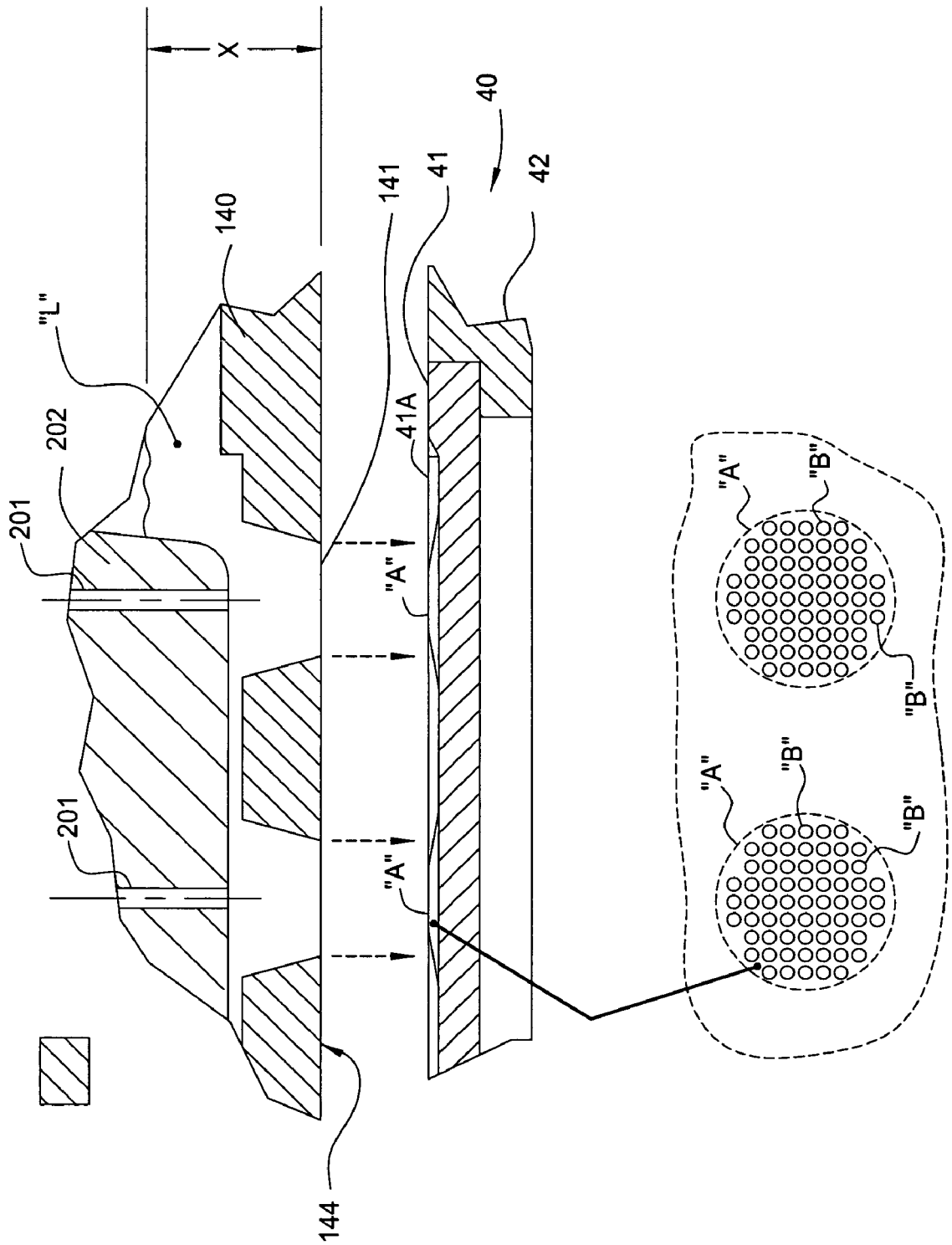

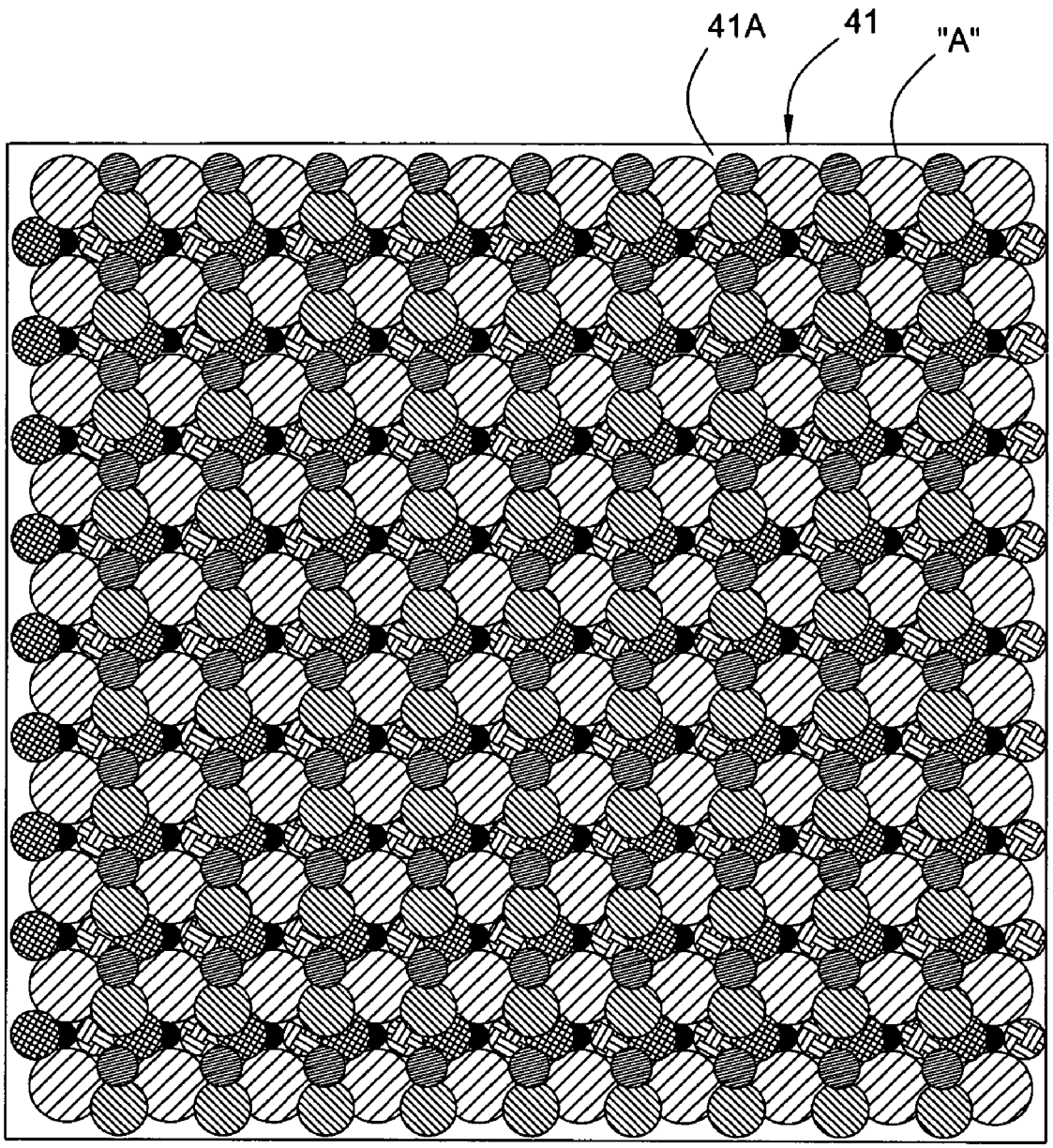
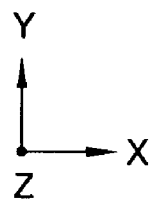
FIG. 10C

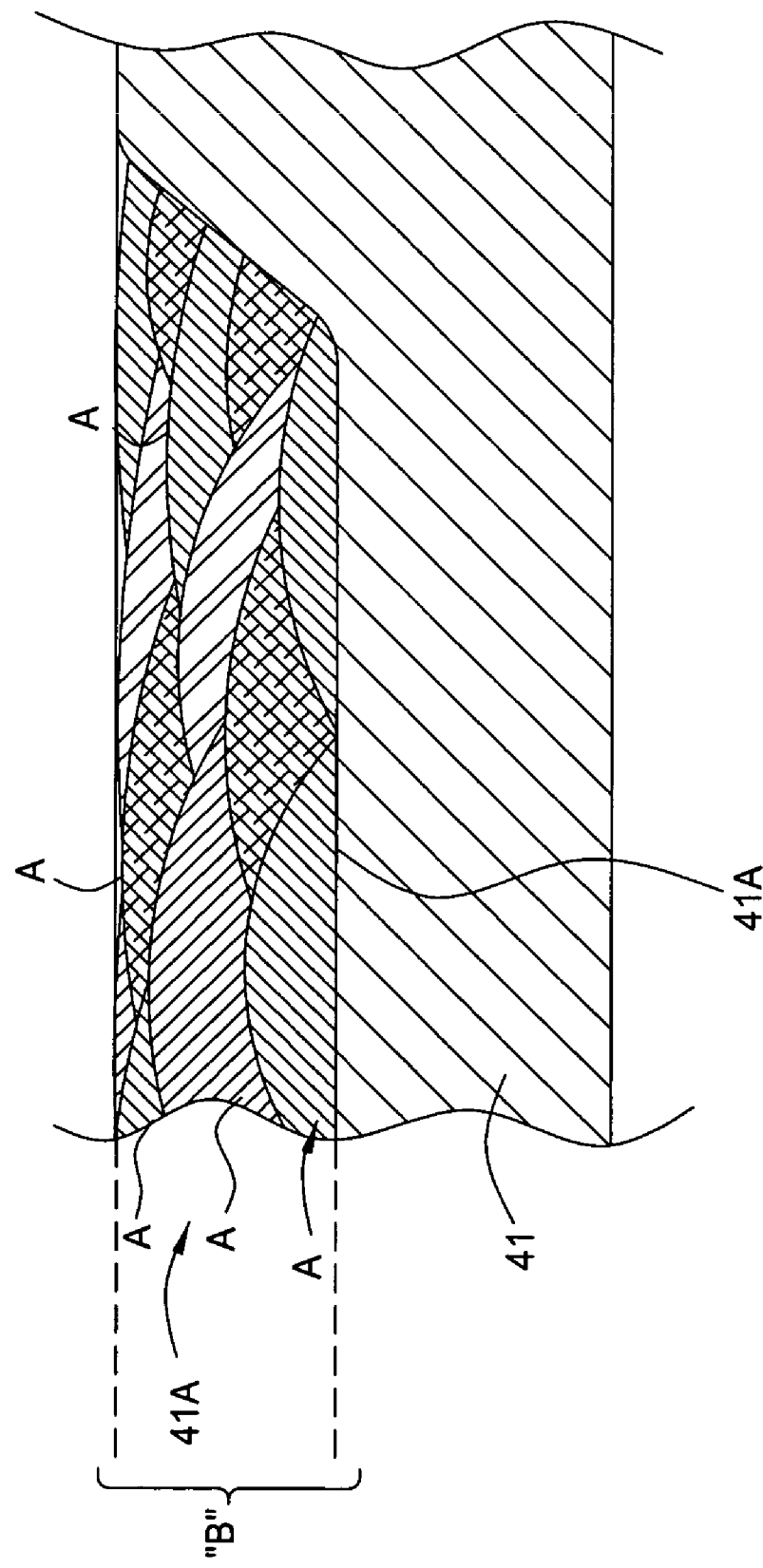

APPARATUS FOR FABRICATING LARGE-SURFACE AREA POLYCRYSTALLINE SILICON SHEETS FOR SOLAR CELL APPLICATION

BACKGROUND OF THE INVENTION

1. Field of the Invention

Embodiments of the present invention generally relate to a solar cell sheet manufacturing apparatus and methods of forming the same.

2. Description of the Related Art

Photovoltaics (PV) or solar cells are devices which convert sunlight into direct current (DC) electrical power. A typical PV cell includes a p type silicon wafer, substrate or sheet typically less than about 0.3 mm thick with a thin layer of n-type silicon on top of a p-type region formed in a substrate. The generated voltage, or photo-voltage, and generated current by the photovoltaic device are dependent on the material properties of the p-n junction and the surface area of the device. When exposed to sunlight (consisting of energy from photons), the p-n junction of the PV cell generates pairs of free electrons and holes. The electric field formed across the depletion region of p-n junction separates the free electrons and holes, creating a voltage. A circuit from n-side to p-side allows the flow of electrons when the PV cell is connected to an electrical load. Electrical power is the product of the voltage times the current generated as the electrons and holes move through an external load and eventually recombine. Solar cells generate a specific amount of power and cells are tiled into modules sized to deliver the desired amount of system power. Solar modules are created by connecting a number of solar cells and are then joined into panels with specific frames and connectors.

The photovoltaic (PV) market has experienced growth with annual growth rates exceeding above 30% for the last ten years. Some articles have suggested that solar cell power production world wide may exceed 10 GWp in the near future. It has been estimated that more than 95% of all photovoltaic modules are silicon wafer based. The high market growth rate in combination with the need to substantially reduce solar electricity costs has resulted in a number of serious challenges for silicon wafer production development for photovoltaics. The amount of solar grade silicon needed to produce solar cells now exceeds the amount of silicon needed by the semiconductor industry.

In general, silicon substrate based solar energy technology follows two main strategies to reduce the costs of solar electricity by use of PV solar cells. One approach is increasing the conversion efficiency of single junction devices (i.e., power output per unit area) and the other is lowering costs associated with manufacturing the solar cells. Since the effective cost reduction due to conversion efficiency is limited by fundamental thermodynamic and physical limits depending on the number of cascaded junctions, the amount of possible gain depends on basic technological advances. Therefore, conversion efficiency improvements are limited making it hard to reach the cost of ownership (CoO) targets. Therefore, one major component in making commercially viable solar cells lies in reducing the manufacturing costs required to form the solar cells.

In order to meet these challenges, the following solar cell processing requirements generally need to be met: 1) the consumption of silicon must be reduced (e.g., thinner substrates, reduction manufacturing waste), 2) the cost of ownership (CoO) for substrate fabrication equipment needs to be improved (e.g., high system throughput, high machine uptime, inexpensive machines, inexpensive consumable costs), 3) the substrate size needs to be increased (e.g., reduce processing per Wp) and 4) the quality of the silicon substrates needs to be sufficient to produce highly efficient solar cells. There are a number of solar cell silicon substrate, or solar cell wafer, manufacturing technologies that are under development to meet the requirement of low silicon consumption in combination with a low CoO. Due to the pressure to reduce manufacturing costs and due to the reduced demands on substrate characteristics, such as surface morphology, contamination, and thickness variation, a number of dedicated substrate manufacturing lines specifically designed to produce solar cells have been established. In these respects solar cell substrates differ in many respects to typical semiconductor wafers.

Crystalline silicon is the material from which the vast majority of all solar cells are currently manufactured. In principle, the most promising substrate manufacturing technologies are the ones where liquid silicon is directly crystallized in the form of a silicon substrate or ribbon (so-called ribbon technologies). Monocrystalline and polycrystalline silicon form the two principle variants of the silicon material used for solar cells. While monocrystalline silicon is usually pulled as a single crystal from a silicon melt using the Czochralski (CZ) process, there are a number of production processes for polycrystalline silicon. Typical polycrystalline silicon processes are block-crystallization processes, in which the silicon substrates are obtained by forming and sawing a solid polycrystalline silicon block, film-drawing processes, in which the substrates are drawn or cast in their final thickness as a silicon film is pulled from a molten material, and sintering processes in which the substrates are formed by melting a silicon powder. Examples of these substrate fabrication process are the EFG process (Edge-defined Film-fed Growth)(e.g., U.S. Pat. No. 5,106,763), the RGS (Ribbon Growth on Substrate) process (e.g., U.S. Pat. No. 4,670,096, U.S. Pat. No. 5,298,109, DE 4,105,910 A1) and the SSP ribbon process (Silicon Sheets from Powder)(e.g., U.S. Pat. No. 5,336,335, U.S. Pat. No. 5,496,446, U.S. Pat. No. 6,111,191, and U.S. Pat. No. 6,207,891). For high speed ribbon type silicon substrate forming processes to be viable the challenge is to reach sufficient substrate quality and solar cell efficiency to provide low cost solar electricity.

Therefore, there is a need to cost effectively form and manufacture silicon sheets for solar cell applications.

SUMMARY OF THE INVENTION

The present invention generally an apparatus for forming a polycrystalline semiconductor sheet comprising a deposition reactor comprising a crucible having one or more walls that form a crucible processing region and a deposition port that are formed in one of the one or more wall, wherein the deposition port is in fluid communication with the crucible processing region, a heater in thermal communication with the crucible, wherein the heater is adapted to heat a feed material positioned in the crucible processing region to a liquid state, and a gas delivery port that are in fluid communication with a fluid source, the feed material positioned in the crucible processing region, and the deposition port, and a sheet support platen having a collection region that is positioned to receive feed material delivered through the deposition port from the crucible processing region.

Embodiments of the invention may further provide an apparatus for forming a polycrystalline semiconductor sheet comprising a deposition reactor comprising a crucible having one or more walls that form a crucible processing region and two or more deposition ports that are formed in one of the one or more wall, wherein the two or more deposition ports are in fluid communication with the crucible processing region, a heater in thermal communication with the crucible, wherein the heater is adapted to heat a feed material positioned in the crucible processing region to a liquid state, and a plurality of gas delivery ports that are in fluid communication with one or more fluid sources, the feed material positioned in the crucible processing region, and the two or more deposition ports, wherein the at least one gas delivery port is in fluid communication with each of the two or more deposition ports, a sheet support platen having a collection region that is positioned to receive feed material delivered through the two or more deposition ports from the crucible processing region, and an actuator adapted position the sheet support platen in direction that is generally parallel to a portion of the wall that has the two or more deposition ports formed therein.

Embodiments of the invention may further provide an apparatus for forming a polycrystalline semiconductor sheet comprising one ore more walls that forms a system processing region, a deposition reactor positioned in the system processing region, wherein the deposition reactor comprises a crucible having one or more walls that form a crucible processing region and a deposition port that are formed in one of the one or more wall, wherein the deposition port is in fluid communication with the crucible processing region, a heater in thermal communication with the crucible, wherein the heater is adapted to heat a feed material positioned in the crucible processing region to a liquid state, and a gas delivery port that are in fluid communication with a fluid source, the feed material positioned in the crucible processing region, and the deposition port, a sheet support platen positioned in the system processing region and having a collection region that is positioned to receive feed material delivered through the deposition port from the crucible processing region, a re-crystallization chamber positioned in the system processing region and having a re-crystallization processing region, wherein the re-crystallization chamber is adapted to heat at least a portion of the feed material deposited on the collection region of the sheet support platen to a desired temperature, and an actuator that is adapted position the sheet support platen in direction that is generally parallel to a portion of the wall that has the two or more deposition ports formed therein and to transfer the sheet support platen through the re-crystallization processing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 is close up view of the processing region illustrated in FIG. 5 in accordance with embodiments of the invention;

FIG. 9 is plan view of solidified drops deposited on the collection region illustrated in FIG. 8 in accordance with embodiments of the invention.

FIG. 10C is a plan view of an array of solidified drops deposited on the collection region of the sheet support assembly in accordance with embodiments of the invention;

FIG. 10D is a side cross-sectional view of the array of solidified drops deposited on the collection region shown in FIG. 10C in accordance with embodiments of the invention;

DETAILED DESCRIPTION

The present invention generally provides an apparatus and method for forming a silicon sheet suitable for use in a solar cell. The desired properties of the sheet fabricated with the teaching of this invention are: flatness, a smooth surface, low residual stress, minority carrier diffusion length greater than 40 microns, and typical grain dimension at least two times the minority carrier diffusion length. In general, aspects of the present invention can be used for solar cell processing, semiconductor processing, or any other sheet processing technique. In one embodiment, the deposition chamber is adapted to form and process sheets that have a large surface area in the range 1,000 to 2,400 cm$^2$. The desired properties of a process for fabricating a sheet appropriate for use as a solar cell in accordance with the teachings of this invention are: low thermal stress, controlled nucleation, controlled grain size distribution, high fabricated sheet throughput, reduced manufacturing cost, and simple process control. It should be noted that the terms semiconductor sheet, silicon sheet, or sheet, as used herein is intended to broadly describe a substrate, wafer, or ribbon that can be used to form a solar cell or other similar semiconductor type devices thereon.

Figure 1:
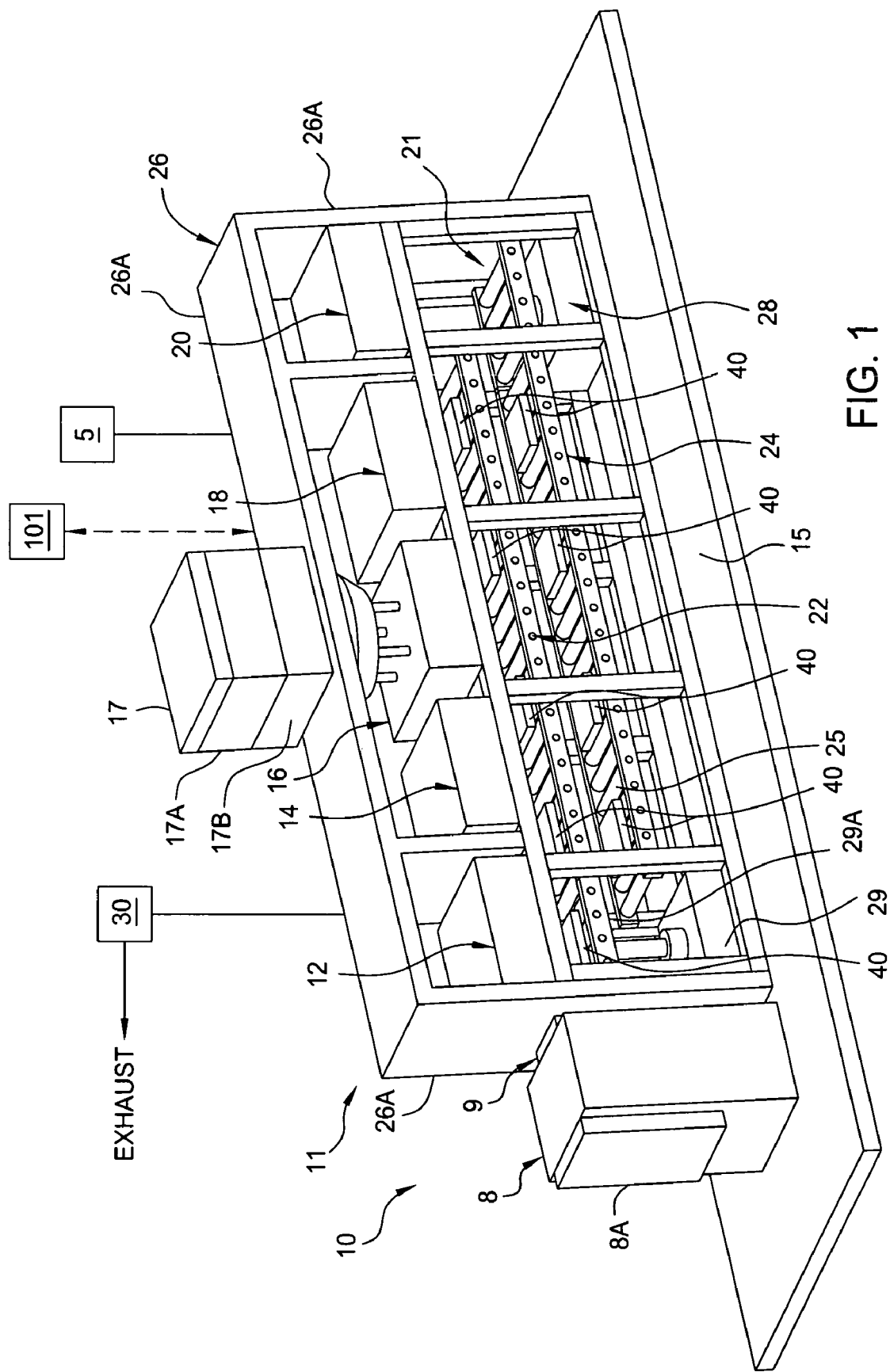
FIG. 1 is an isometric view illustrating one embodiment of a solar cell processing system of the invention.
Figure 2:
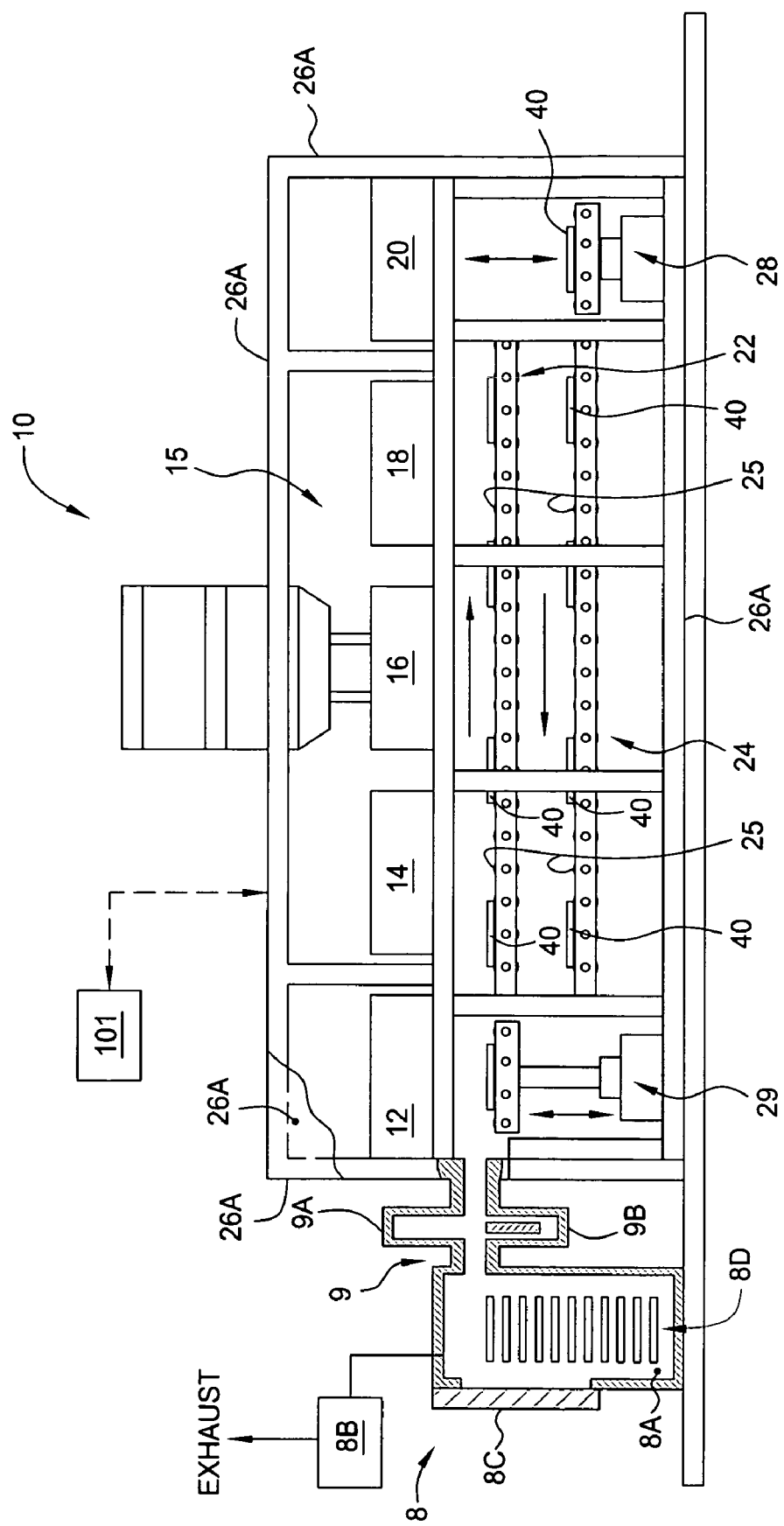
FIG. 2 is a side cross-sectional view of the solar cell processing system according to this invention.

FIG. 1 illustrates an isometric view of one embodiment of a solar cell processing system 10, hereafter processing system 10, which may be used to form a sheet suitable for a solar cell type application. FIG. 2 illustrates a side cross-sectional view of the processing system 10 illustrated in FIG. 1. The processing system 10 generally contains a load lock 8 and a plurality of processing chambers 11 that are positioned within an enclosure 26. The plurality of process chambers 11 generally include, but are not limited to: a load/unload station 12, a preheat station 14, a deposition reactor 16, a re-crystallization chamber 18, a cool-down chamber 20, and a robot transferring device 21. In one embodiment of processing system 10, the enclosure 26 contains one or more walls 26A that enclose the plurality of process chambers 11 in a the system processing region 15 which is maintained in a vacuum state by use of one or more vacuum pumps 30 to minimize the amount of contamination that can affect the processes performed in the system processing region 15. In one aspect, the vacuum pumps, which may be a turbo pump, rough pump, and/or Roots Blower™, are adapted to maintain the system processing region 15 at a base pressure between about up to about $10^{-9}$ Torr. The pressure in the processing region 15 during processing may vary between about $10^{-3}$ Torr and about 760 Torr. In another embodiment, an inert gas having a low partial pressure of oxygen ($O_2$), water ($H_2O$), carbon dioxide ($CO_2$) and other contaminants is delivered through the system processing region 15, which is maintained at a pressure at or near atmospheric pressure, from an inert gas source 5. Examples of typical inert gases may include argon, nitrogen and/or helium. In one aspect, the partial pressure of oxygen ($O_2$), water ($H_2O$), carbon dioxide ($CO_2$) and other critical contaminants are kept below about $10^{-10}$ Torr by use of a vacuum pump or pure inert gas purge of the processing system 10.

In one embodiment, the processing system 10 contains a load lock 8 that is adapted to receive sheets formed in the processing system 10. The load lock 8 is in communication with system processing region 15 through a sealed access port 9 (FIG. 2) formed in one of the walls 26A of the enclosure 26. Referring to FIG. 2, in one aspect, the load lock 8 is connected to a vacuum pump 8B that is adapted to evacuate a sealed region 8A inside the load lock 8, which is isolated from outside atmospheric environment, prior to opening the sealed access port 9 so that a sheet can be transferred between the sealed region 8A and the evacuated system processing region 15 or vice versa. The sealed access port 9 may be covered by a gate valve 9A having an isolation door 9B that is adapted to isolate the sealed region 8A from the system processing region 15. In one aspect, a sealable access door 8C is positioned on one or more of the walls of the load lock 8 to allow access to the sheets retained in the sealed region of the load lock 8. In one aspect, the load lock 8 contains a plurality of cassette shelves 8D that may be positioned by a lift actuator (not shown)(e.g., conventional semiconductor sheet cassette indexing device) to individually receive a sheet transferred through the sealed access port 9 from the system processing region 15. In one aspect, the lift actuator may be a conventional type semiconductor wafer cassette indexing device.

In general the robot transferring device 21 is adapted to position and transfer one or more sheet support assemblies 40, on which the solar cell sheet is to be formed, through the various processing chambers 11 positioned in the system processing region 15. Referring to FIGS. 1 and 2, in one embodiment, the robot transferring device 21 contains a process level conveyor 22, a return level conveyor 24, and lift mechanism assemblies 28 and 29. In one aspect, the process level conveyor 22 and return level conveyor 24 comprise a conventional roller bed, which contain a plurality of rollers 25 that are coupled to a conveyor actuator (not shown). In this configuration each of the sheet support assemblies 40 rests on a plurality of rollers 25 and are positioned by the rollers 25, due to contact between the rollers 25 and the sheet support assemblies 40. In one aspect, the conveyor actuator is a direct drive linear brushless servomotor that may be purchased from Danaher Motion of Wood Dale, Ill. or Aerotech, Inc. of Pittsburgh, Pa., or a conventional DC servo motor, that is coupled to the rollers 25 by belts, gears or other conventional means. In one aspect, the rollers 25 are made of a ceramic material, such as silicon carbide (SiC), boron nitride (BN) that is adapted to withstand the temperatures of the processes described below. In one aspect, it may be desirable to form a composite structure in which a ceramic material contacts the sheet support 40 as it is transferred through the processing system 10 and a metal sub-structure, which is able to withstand the high temperatures (e.g., super alloys, refractory metals, stainless steels), is used to form the structural and rotational elements of the roller 25. In one aspect, each of the rollers 25 may be actively cooled by use of a heat exchanging fluid that is delivered through the roller 25 by use of a conventional rotational vacuum feed-thru (e.g., differentially pumped lip seals) and a conventional rotational liquid feed-thru, which are well known in the art. An alternate device that may be adapted to transfer the sheet support assemblies 40 through the system processing region 15, which may be at a pressure below atmospheric pressure, is further described in the commonly assigned U.S. Pat. No. 6,679,671, filed Sep. 16, 2002, which are incorporated by reference in its entirety to the extent not inconsistent with the present disclosure.

Referring to FIGS. 1, 4 and 8, the sheet support assembly 40 generally has a sheet support platen 41 on which the sheet is formed (discussed below) and a support element 42 that is adapted to support and thermally isolate the sheet support platen 41 from the transferring device 21. Referring to FIGS. 4 and 8, the sheet support platen 41 has a collection region 41A formed in its top surface. The collection region 41A is generally is generally a square or rectangular depression formed in the sheet support platen 41 that is adapted to receive the deposited sheet material delivered from the deposition reactor 16 (discussed below). In one aspect, the depth of the collection region 41A is about the desired thickness of the sheet formed in the processing system 10 (e.g., 100-250 micrometers (μm)). In one aspect, the sheet support platen 41 is made of ceramic material, such as silicon carbide (SiC), silicon nitride (SiN), boron nitride (BN), graphite (C), boron carbide ($B_4C$) or other suitable material, or combinations thereof, that will not contaminate the material deposited during processing. The support element 42 may be made from a ceramic material such as alumina ($Al_2O_3$), zirconia ($ZrO_2$), silicon carbide (SiC), silicon nitride (SiN), boron nitride (BN), graphite (C), boron carbide ($B_4C$) or other suitable material that will generate particles as it is transferred through the processing system 10 and tends to thermally isolate the sheet support platen 41 from the robot transferring device 21.

During processing a robot 29A on the front lift mechanism assembly 29 transfers a sheet support assembly 40 to the process level conveyor 22, which then passes the sheet support assembly 40 through the processing chambers 11 (e.g., elements 12, 14, 16, 18, 20). Once the sheet is formed on the collection region 41A in the deposition reactor 16 and has been processed in the re-crystallization chamber 18 and cool-down chamber 20, the sheet support assembly 40 is then transferred to the rear lift mechanism assembly 28 by the process level conveyor 22. The sheet support assembly 40 is then lowered to the return level conveyor 24 by the rear lift mechanism assembly 28 where it is transferred to the return level conveyor 24 by a rear robot 28A that is in communication with the rear lift mechanism assembly 28. The sheet support assembly 40 is then transferred to the front lift mechanism assembly 29 by the return level conveyor 24. The sheet "W" is separated from the sheet support assembly 40 by use of a robot (not shown) in the load/unload station 12 that is adapted to pick-up the sheet from the sheet support platen 41 and transfer it to the load lock 8 positioned outside the system processing region 15 through an access port 9 formed in one of the walls 26A of the enclosure 26.

To control the various processing system 10 processing chambers, system components and process variables during a sheet deposition process, a controller 101 is used. The processing system's processing variables may be controlled by use of the controller 101, which is typically a microprocessor-based controller. The controller 101 is configured to receive inputs from a user and/or various sensors in the system and appropriately control the components in accordance with the various inputs and software instructions retained in the controller's memory. The controller 101 generally contains memory and a CPU which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like all well known in the art. A program (or computer instructions) readable by the controller 101 determines which tasks are performable in the system. Preferably, the program is software readable by the controller 101 and includes instructions to monitor and control the plasma process based on defined rules and input data.

Transfer and Process Sequence(s)

Figure 3:
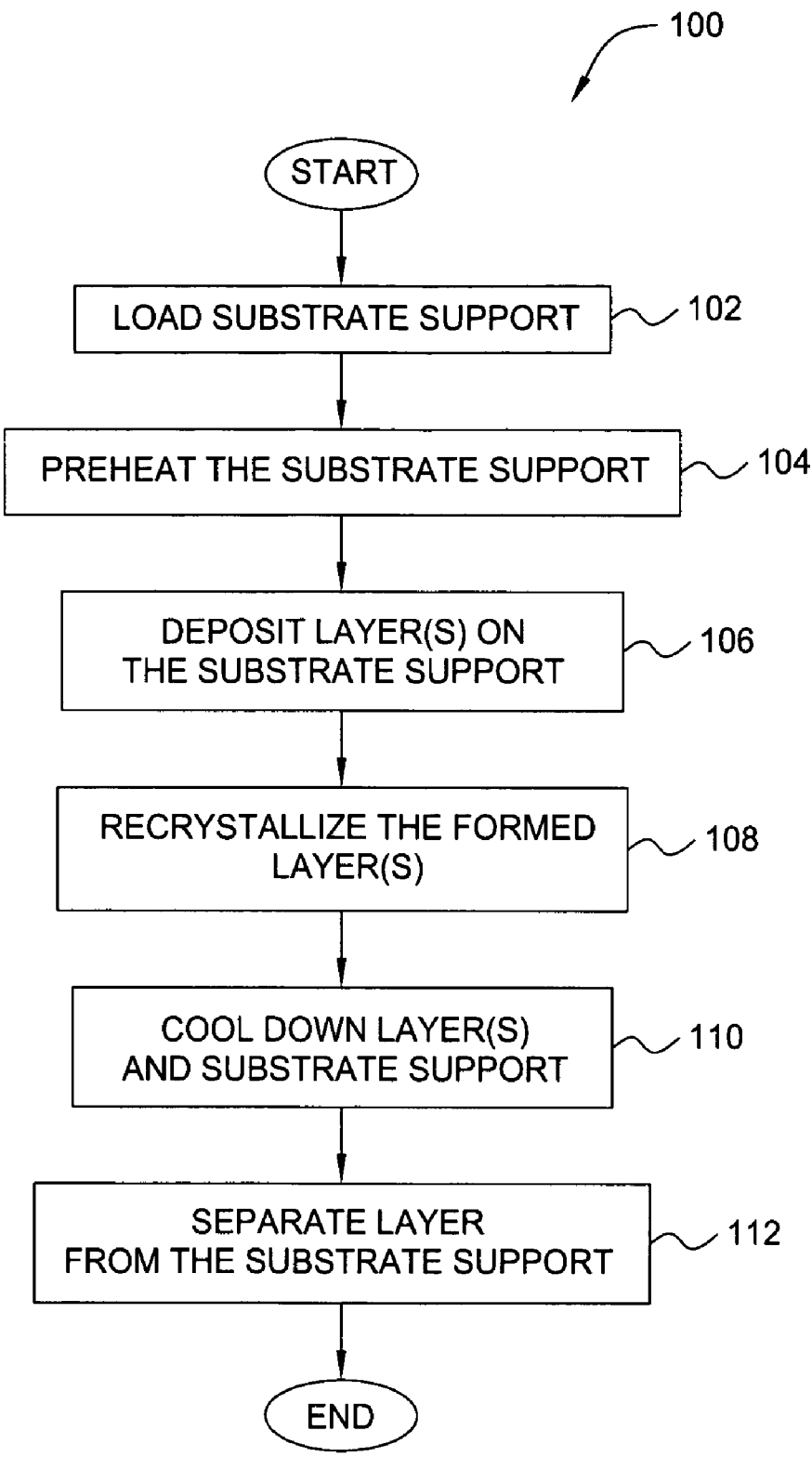
FIG. 3 illustrates one embodiment of a process sequence containing various process recipe steps that may be used in conjunction with the various embodiments of the cluster tool described herein.

FIG. 3 illustrates one embodiment of a process sequence 100 containing various process recipe steps (elements 102-112) that may be used in conjunction with the various embodiments of the processing system 10 described herein. In step 102 a sheet support assembly 40 is delivered to the process level conveyor 22 from the front lift mechanism assembly 29.

In step 104 the sheet support assembly 40 is heated to a desired temperature which is generally near or below the melting point of the material that will be deposited on the sheet support assembly 40 in the deposition reactor 16 (FIG. 1). For example, the melting point of silicon is about 1410° C. at atmospheric pressure conditions. In one aspect, the sheet support assembly 40 is heated by use of an inductive, optical, radiant or other conventional type heater to a temperature between about 1000° C. and about 1430° C. prior to depositing a silicon (Si) material in the deposition reactor 16. In one aspect, a resistive heating element is imbedded within the sheet support assembly 40 to control temperature of the sheet support assembly 40 during processing. Preferably, it is desirable to heat the sheet support assembly 40 to a temperature between about 1200° C. and about 1400° C. prior to depositing a silicon material in the deposition reactor 16. In one embodiment of step 104, the sheet support assembly 40 is preheated as it is transferred through the preheat station 14 by use of the robot transferring device 21. An example of an exemplary preheat station 14 is further described in conjunction with FIG. 11 below.

In step 106 the sheet support assembly 40 is transferred through the deposition reactor 16 where a material is deposited on a surface of the sheet support assembly 40 positioned on the process level conveyor 22 in the processing system 10 to form the sheet. In one aspect, the deposition process is performed in the deposition reactor 16 by taking in a "feed material" and then depositing the heated "feed material" on the sheet support assembly 40. The feed material is generally brought to the material loading module 17 (FIG. 4A) of the deposition reactor 16 in a solid state, such as silicon (Si) in a powder, granular or pellet form. In one aspect, it may be desirable to use a feed material that has a particle size ranging between about 0.01 and about 3 millimeters (mm), and preferably ranging between about 1 mm and about 3 mm. In one embodiment, the feed material is a silicon (Si) material that has a p-type or n-type dopant added to it so that the sheet formed will have a desired doping level. P-type dopants are generally elements, such as phosphorus (P) and arsenic (As) and n-type dopants are generally elements, such as boron (B). The deposition reactor 16 is further described below in conjunction with FIGS. 4-10.

In step 108 the sheet support assembly 40 is transferred through the re-crystallization chamber 18 where the sheet support assembly 40 is heated to a temperature at or above the melting point of the material that was deposited on the sheet support assembly 40 in the deposition reactor 16 to allow the deposited material to melt and then re-solidify. In one aspect, the sheet is heated to a temperature above the melting point of the sheet material, such as about ≧1410° C. for a silicon sheet, to perform a zone refining process.

In another embodiment of step 108, the deposited feed material is heated to a temperature at or below the melting point of the feed material to allow the deposited material to re-crystallize. In one aspect, the sheet support assembly 40 is heated by use of a conventional heater to a temperature between about 0.7 and about 0.99 of the melting point of the material deposited on the sheet support assembly 40. The term recrystallize as used herein is generally intended to refer to a heat treatment process wherein the microstructure of a material is altered, causing changes in its properties such as electrical properties, internal stress, strength and hardness. Typically, the heat treating process results in the removal of crystal defects, internal stresses, and possibly redistribute dopant atoms in the crystal lattice.

Figure 12:
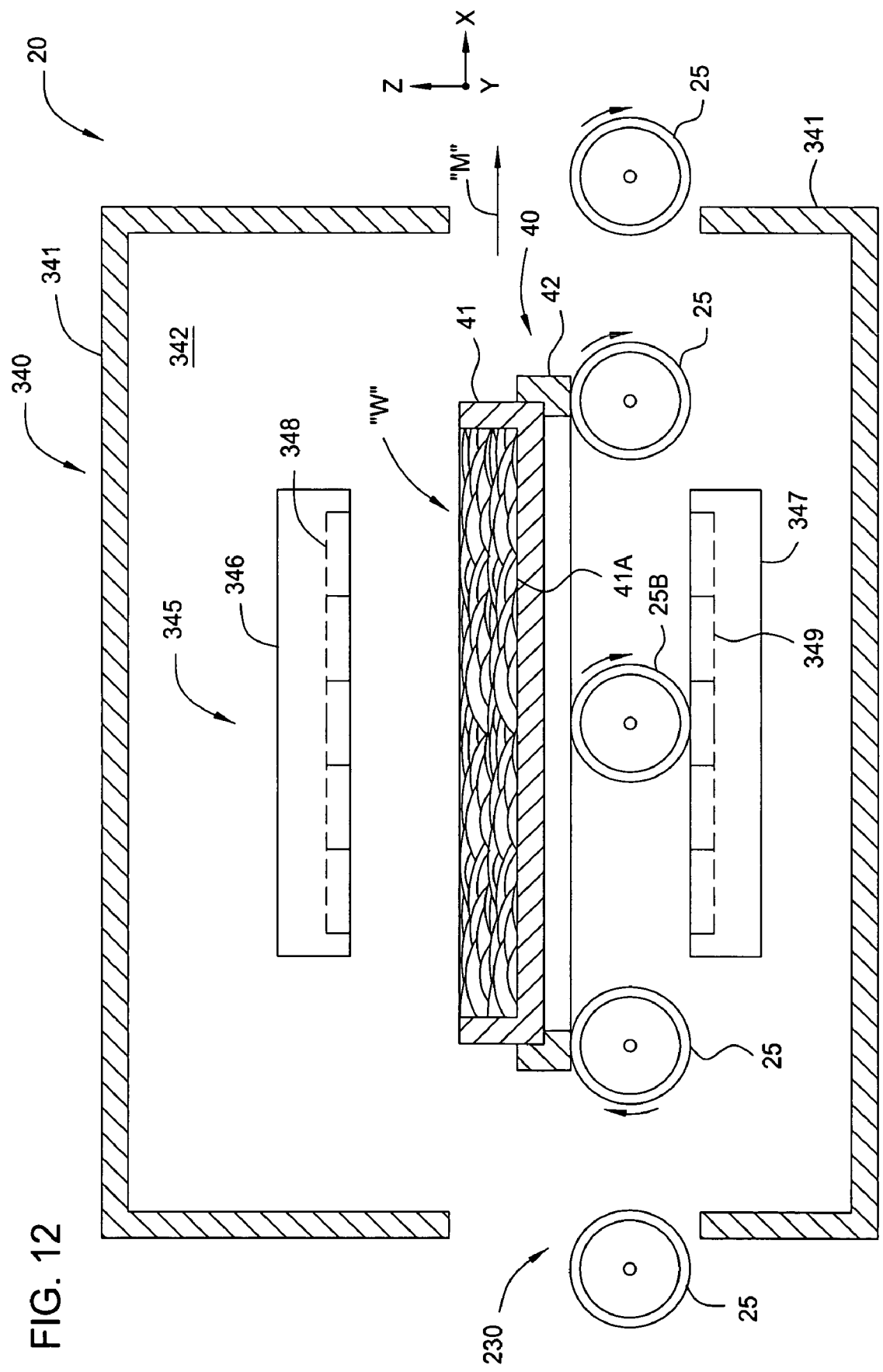
FIG. 12 is a side cross-sectional view of cool down chamber in accordance with embodiments of the invention.

In step 110 the sheet support assembly 40 is cooled to a desired temperature so that the sheet can then be separated from the sheet support platen 41 and then transferred to the load lock 8 in step 112. In one aspect, the sheet support assembly 40 is cooled by positioning the sheet in close proximity to a cold walled environment (FIG. 12) until the sheet reaches a temperature between about 100° C. and about 650° C. In one aspect, it may be desirable to flow an inert gas through the cooling region of the cool-down chamber 20 to utilize convective, conductive, and radiative type cooling of the sheet in the cool-down chamber 20. In one embodiment of step 110, the sheet support assembly 40 is cooled as it is passes through the cool-down station 20 by use of the robot transferring device 21. In one aspect, it may be desirable to cool the sheet support assembly 40 all at once rather than one region at a time to reduce the stress induced in the cooled sheet "W" (FIG. 12).

Finally, in step 112 the sheet is separated from the sheet support assembly 40 so that the sheet formed in the sheet support assembly 40 can be removed from the system processing region 15. In one aspect, the sheet support assembly 40 is coated with a parting material prior to performing the step 106 in the deposition reactor 16. The parting material is added to allow the deposited sheet "W" to be more easily separate the sheet from the sheet support assembly 40. In one aspect, the material from which the sheet support platen 41 is made is adapted to allow for the sheet to easily separated from the sheet support assembly 40.

Deposition Reactor

Figure 4A:
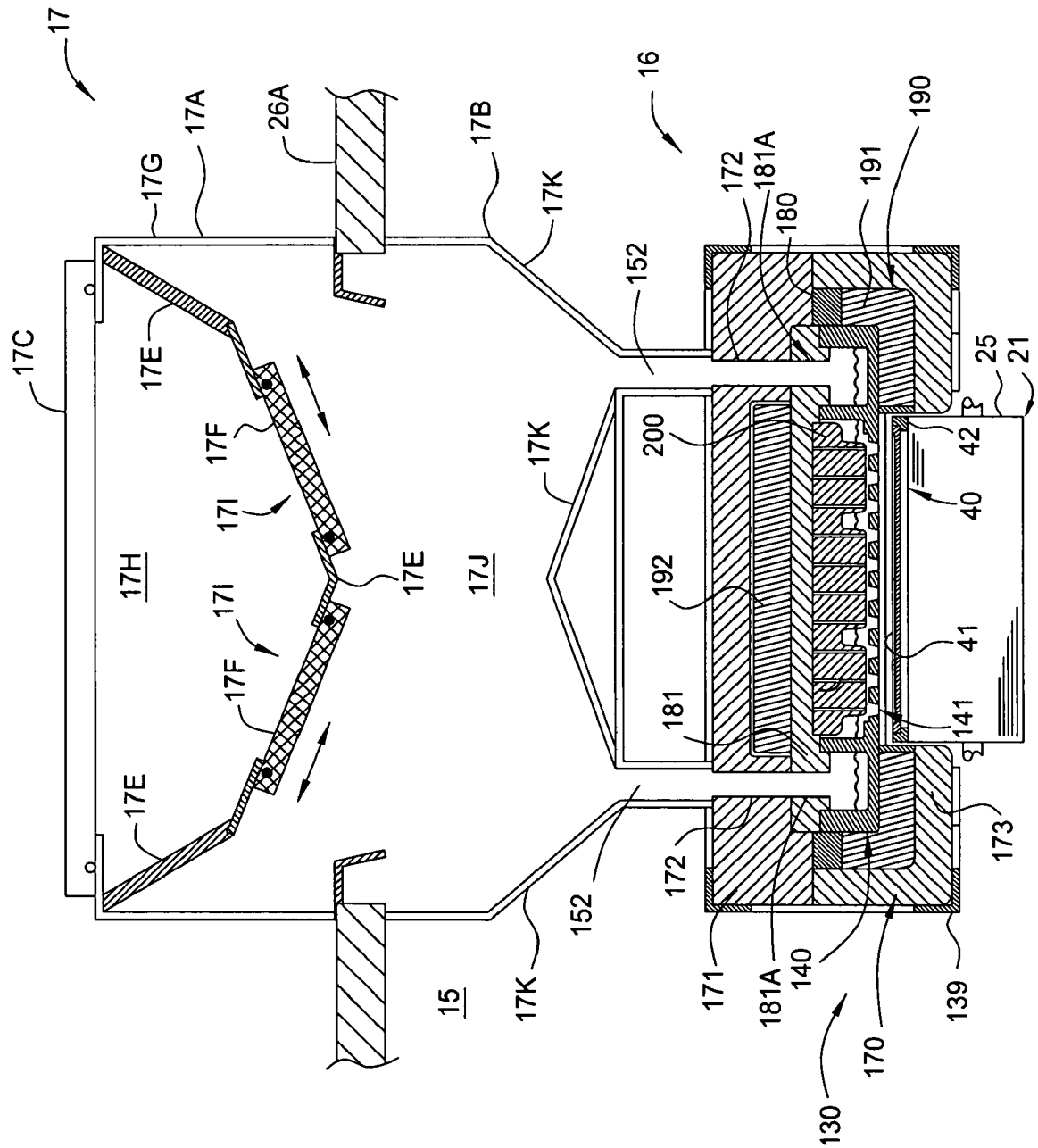
FIG. 4A is a side cross-sectional view of deposition reactor in accordance with embodiments of the invention.

FIG. 4A illustrates one embodiment of a deposition reactor 16 that may be used to perform step 106. The deposition reactor 16 generally contains a deposition chamber 130 and a material loading module 17. The material loading module 17 contains a load lock assembly 17A and a delivery assembly 17B that are attached to the crucible lid assembly 180 of the deposition chamber 130. In general, the material loading module 17 is sealed so that the feed material loaded into the load lock assembly 17A through the lid 17C can be transferred into the delivery region 17J of the delivery assembly 17B which may be at a pressure below atmospheric pressure. In one aspect, the delivery region 17J is maintained at a vacuum pressure, since it is in communication with the system processing region 15. In one aspect, the material loading module 17A is separated from the delivery assembly 17B by an isolation wall 17E and moveable isolation doors 17F. In one aspect, the load region 17H can be evacuated by use of a conventional vacuum pump (not shown) that is in communication with the load region 17H so that the pressure differential between the load region 17H and the delivery region 17J can be made generally equal before material is transferred between the load lock assembly 17A and the delivery assembly 17B.

Figure 4B:
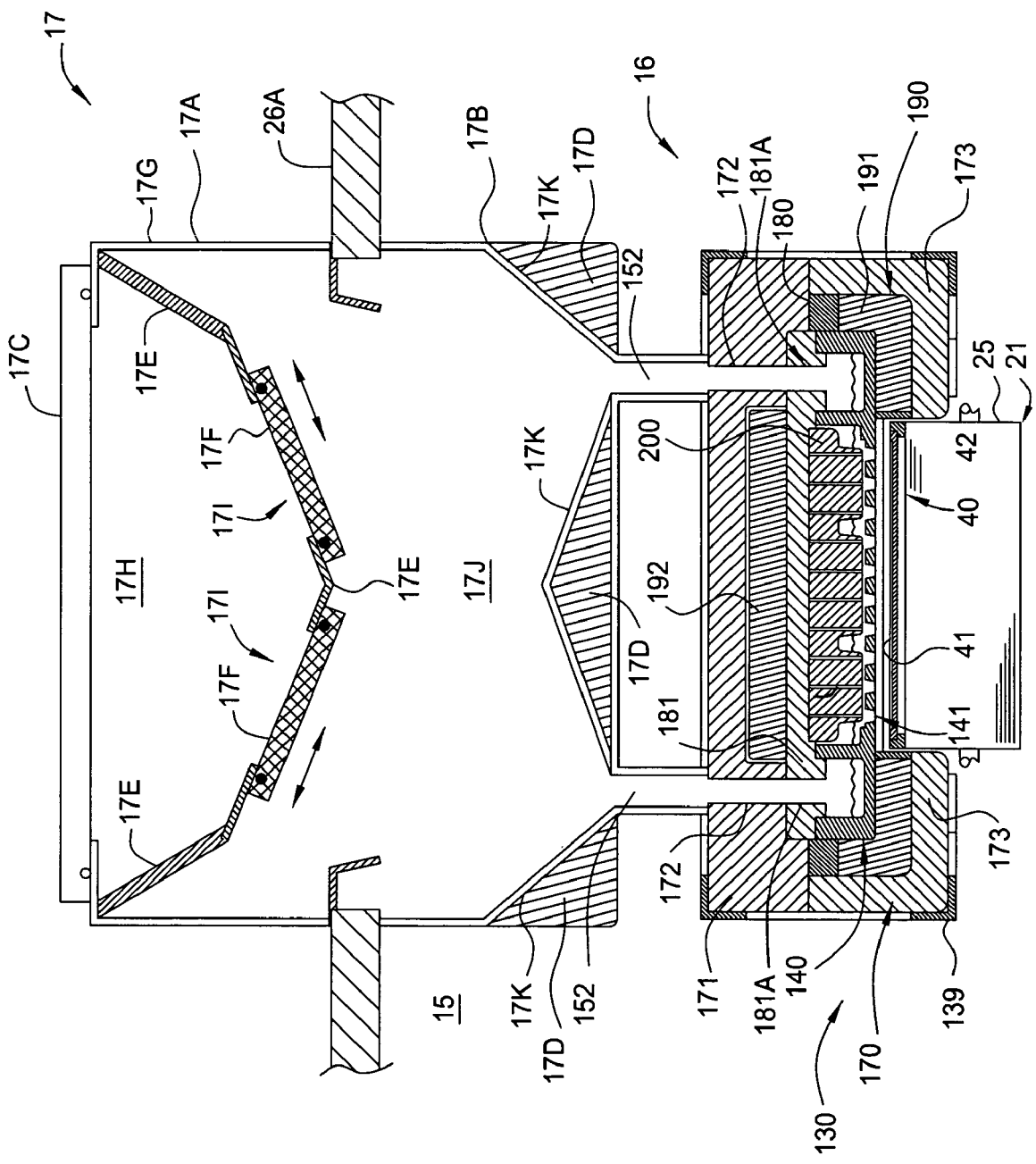
FIG. 4B is a side cross-sectional view of deposition reactor in accordance with embodiments of the invention.

In one embodiment of the material loading module 17, shown in FIG. 4B, the delivery assembly 17B has one or more heaters 17D that are adapted to cause the feed material positioned in the delivery assembly 17B to change from a solid to a liquid state. In this configuration the feed material is delivered into the deposition chamber 130 in a liquid rather than a solid state. The walls 17K of the delivery assembly 17B may be made of ceramic material, such as silicon carbide (SiC), silicon nitride (SiN), boron nitride (BN), graphite (C), boron carbide ($B_4C$) or other suitable material, or combinations of materials that will not contaminate the feed material during processing and withstand temperatures that may exceed about 1430° C.

Figure 4C:
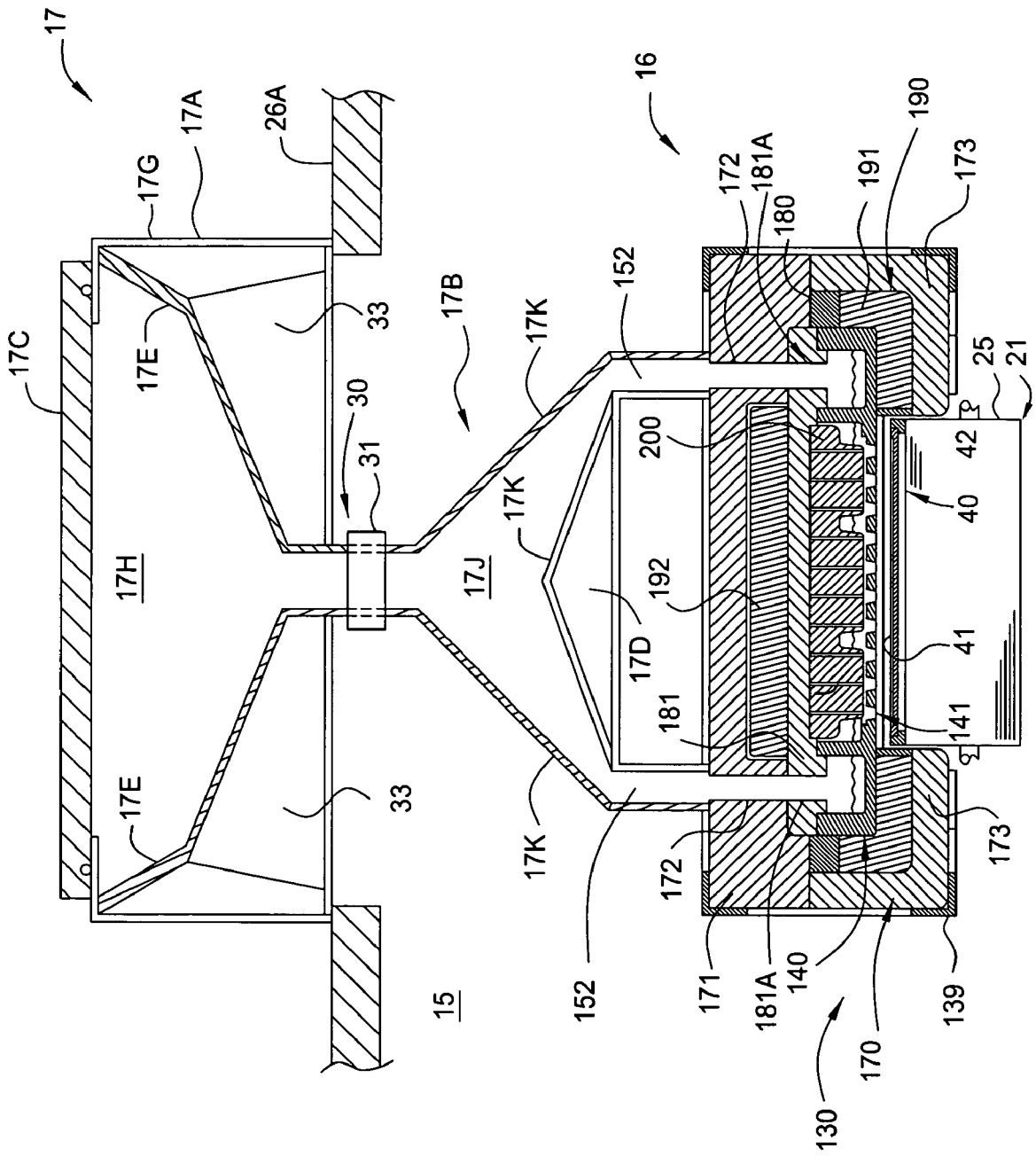
FIG. 4C is a side cross-sectional view of deposition reactor in accordance with embodiments of the invention.

In one embodiment of the material loading module 17, shown in FIG. 4C, the material loading module 17 contains a load lock assembly 17A and a delivery assembly 17B that are connected to each other by use of a fluid delivery connection 30. In one aspect, an isolation valve 31 may be used to allow the load lock assembly 17A to be isolated and sealed from the delivery assembly 17B. In this configuration, the load lock assembly 17A may be heated by use of a heater 33 so that the feed material retained in the load region 17H can be liquefied and then delivered to the delivery assembly 17B. In general, the load lock assembly 17A is capable of being isolated from the delivery assembly 17B using the isolation valve 31 so that it can be filled with the feed material from the region outside the system. Isolation between the two assemblies (elements 17A and 17B) can be important where the delivery assembly 17B is maintained at a vacuum state. In one embodiment, the isolation valve 31 and the controller 101 are adapted to control the amount and/or flow rate of the liquid feed material that is transferred between the load lock assembly 17A and the crucible 140 through the delivery assembly 17B. The walls 17K of the load lock assembly 17A and delivery assembly 17B may be made of ceramic material, such as silicon carbide (SiC), silicon nitride (SiN), boron nitride (BN), graphite (C), boron carbide ($B_4C$) or other suitable material, or combinations of materials that will not contaminate the feed material during processing and withstand temperatures that may exceed about 1430° C.

Figure 5:
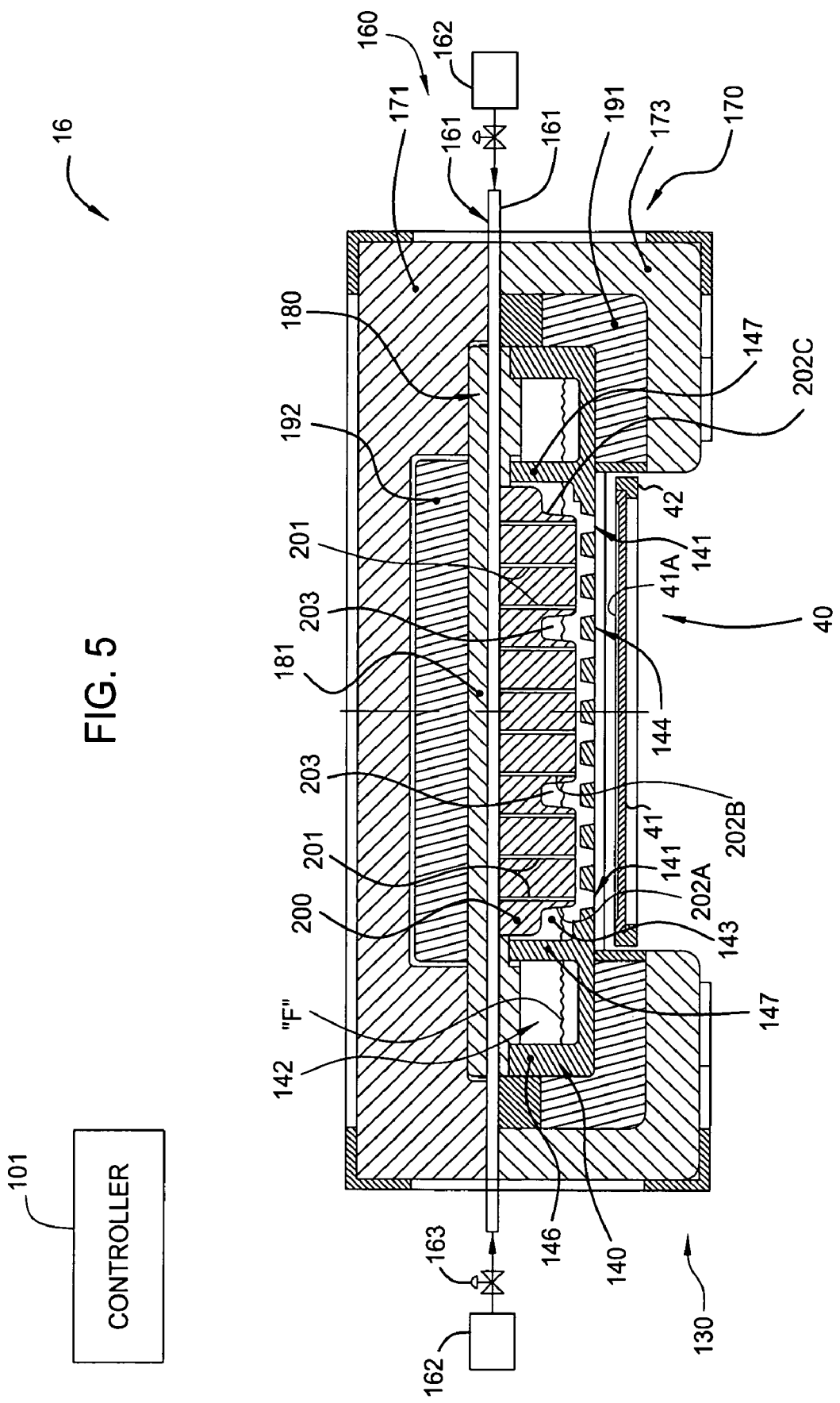
FIG. 5 is a side cross-sectional view of deposition reactor in accordance with embodiments of the invention.

Referring to FIGS. 4, 4A-B and 5, in one embodiment, the deposition chamber 130 contains a crucible 140, a crucible lid assembly 180, a heater assembly 190, and an insulation assembly 170. In general, the feed material is loaded into the crucible 140 through the ports 172 formed in the crucible lid insulation assembly 171 and lid assembly 180 from the material loading module 17. The crucible 140 is generally made of ceramic material, such as silicon carbide (SiC), silicon nitride (SiN), boron nitride (BN), graphite (C), boron carbide ($B_4C$) or other suitable material, or combinations thereof, that will not contaminate the feed material during processing and withstand temperatures that may exceed about 1430° C. The crucible 140 generally has a processing region 143 into which the feed material in the liquid state flows so that it can be delivered to the sheet support assembly 40 through a plurality of deposition ports 141 formed in the crucible base 144. In one aspect, the crucible 140, as shown in FIG. 5 also contains a separate feed material loading region 142 in which the feed material is first loaded from the material loading module 17 before it enters the processing region 143.

Referring to FIG. 5, in one embodiment, the lid assembly 180 generally contains the crucible lid 181 and an injection plate 200 which in combination with the outer walls 146 of the crucible 140, enclose the processing region 143 and optional feed material loading region 142. The crucible lid 181 and injection plate 200 are generally made of ceramic material, such as silicon carbide (SiC), silicon nitride (SiN), graphite (C), boron nitride (BN), boron carbide ($B_4C$) or other suitable material, or combinations of materials that will not contaminate the feed material during processing and withstand temperatures that may exceed about 1430° C.

In one aspect, the lid assembly 180 also contains a manifold assembly 160 that is used to provide fluid communication between one or more gas sources 162 (FIG. 5) and the delivery ports 201 formed in the injection plate 200. In general, the delivery ports 201 formed in the injection plate 200 are aligned with the plurality of deposition ports 141 formed in the crucible base 144 so that a gas delivered through the delivery ports 201 can push the liquid feed material retained in the processing region 143 through the deposition ports 141 and on to the sheet support assembly 40.

Figure 6:
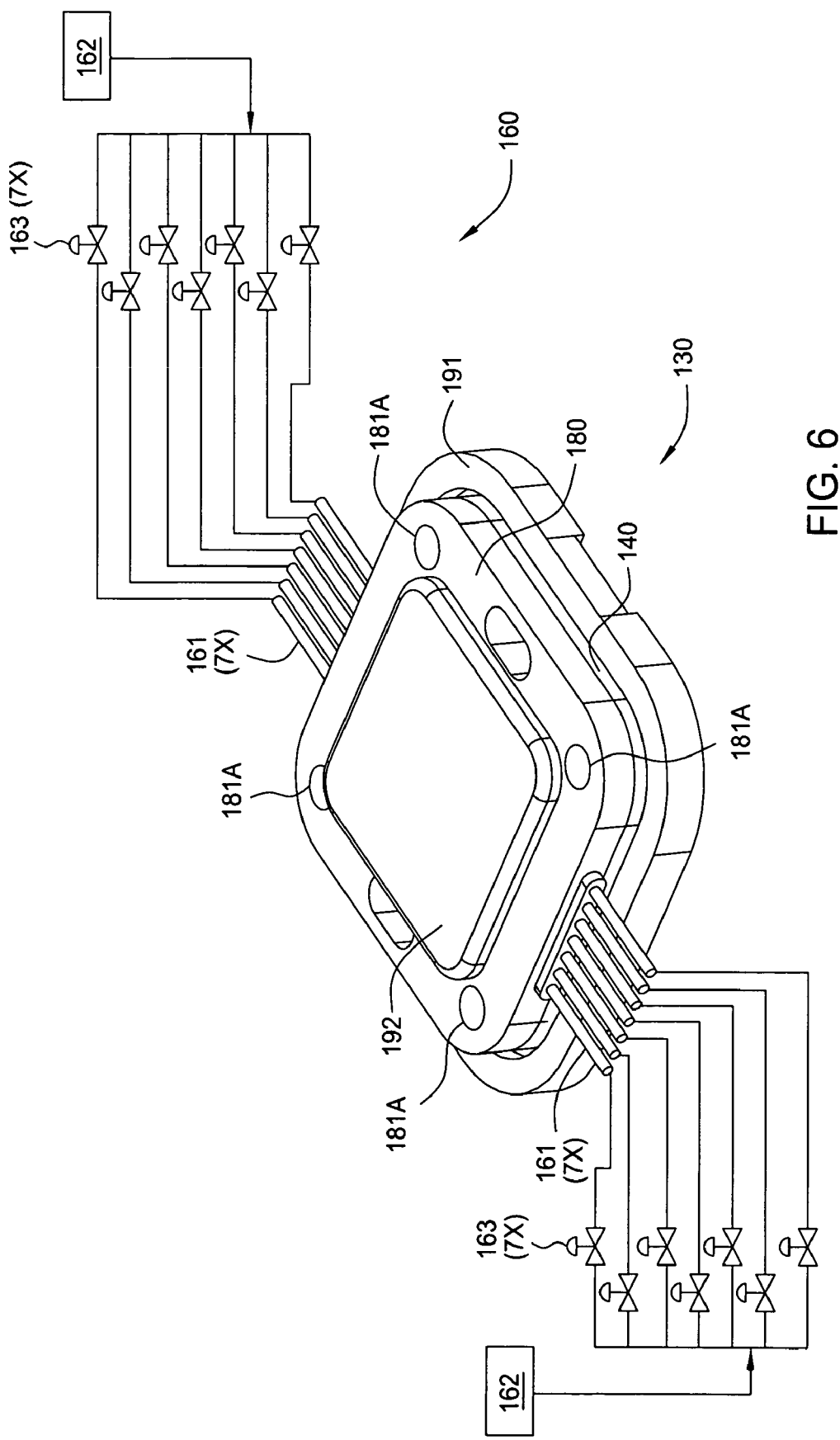
FIG. 6 isometric view of one embodiment of the deposition chamber in accordance with embodiments of the invention.

FIG. 6 schematically illustrates an isometric view of one embodiment of the deposition chamber 130, the heater assembly 190 and the manifold assembly 160. It should be noted that some common components (e.g., insulation assembly 170) have been left out of this view for clarity. The manifold assembly 160 generally contains a plurality of tubes 161, a plurality of valves 163 and one or more fluid sources 162. The plurality of tubes 161 are generally formed in the lid assembly 180 and/or attached to the lid assembly 180 using a heat resistant tubing near the deposition chamber 130 and conventional tubing a distance away from the hot deposition chamber 130. In one aspect, the heat resistant tubing is a quartz, SiC, SiN, graphite (C), boron nitride (BN), boron carbide ($B_4C$) or other suitable material, or combinations of materials that is able to withstand the high temperatures experienced by the lid assembly 180. In one aspect, the heat resistant tubing is attached, bonded or high temperature brazed to the crucible lid 181.

Figure 7:
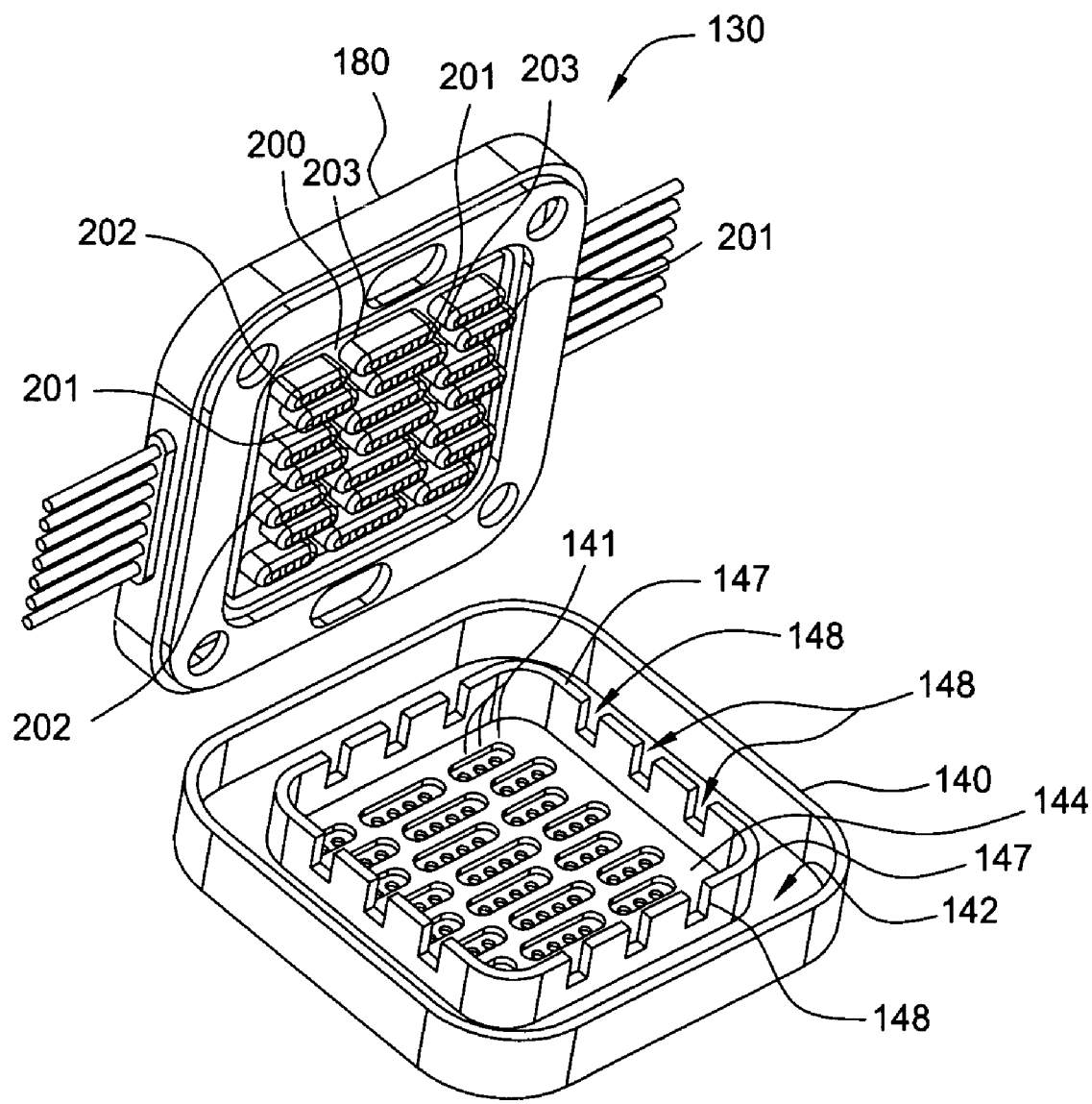
FIG. 7 an isometric view of one embodiment of the deposition chamber in which the lid assembly has been separated and tilted at an angle relative to the crucible in accordance with embodiments of the invention.

Referring to FIGS. 5, 6, and 7, in one aspect of the lid assembly 180, each of the delivery ports 201 formed (e.g., approximately 70 total shown in FIG. 7) in each of the gas injection features 203 are connected to the fluid source 162 through a single valve 163 (FIGS. 5 and 6) so that the flow of gas delivered through each of the delivery ports 201 can be automatically controlled by use of the controller 101 (FIG. 5).

Referring to FIG. 5, in another aspect of the lid assembly 180, a plurality of delivery ports 201 formed in each of the gas injection features 203 are connected together and are all in fluid communication with a fluid source 162 through a single valve 163. For example, referring to FIG. 5, the injection feature 202A has three delivery ports 201 that are connected to a first valve (not shown), an injection feature 202B has four delivery ports 201 that connected to a second valve (not shown) and an injection feature 202C has three delivery ports 201 that are connected to a third valve (not shown). In this configuration, by use of commands from the controller 101 one of the valves (e.g., first valve, second valve, third valve) can be opened and a gas will be delivered through one of the tubes 161 to the connected delivery ports 201 and finally to the aligned deposition ports 141 so that the liquid feed material can be pushed through the deposition ports 141 and onto the collection region 41A. In one aspect, the size and length of the delivery ports 201 formed in the injection plate 200 are sized so that the gas flow passing through each of the connected delivery ports 201 is relative uniform through each delivery port 201.

FIG. 7 illustrates an isometric view of one embodiment of the deposition chamber 130 in which the lid assembly 180 has been separated and tilted at an angle relative to the crucible 140 so that the various internal components found in the processing region 143 can be clearly illustrated. In one aspect of the deposition chamber 130, the injection plate 200 has a plurality of gas injection features 202 in which the delivery ports 201 are formed. Referring to FIGS. 5 and 7, the gas injection features 202 are separated from one another by a channel region 203 which allows the liquid feed material to flow through the processing region 143 to the deposition ports 141 formed in the crucible base 144.

The heater assembly 190 generally contains a lid heating assembly 192 and crucible heating assembly 191 that are adapted to uniformly heat the crucible 140 and lid assembly 180. The lid heating assembly 192 and crucible heating assembly 191 are adapted to evenly distributed a desired amount of heat across the outer walls of the crucible 140 and lid assembly 180 (e.g., elements 146 and 181) to generally form an isothermal environment in the processing region 143. The insulation assembly 170 generally contains a crucible insulation assembly 173 and a crucible lid insulation assembly 171 which are used to thermally isolate the crucible 140, crucible lid assembly 180, and heater assembly 190 from the all of the other components found in the solar cell processing system 10. The crucible insulation assembly 172 and crucible lid insulation assembly 171 generally contain high temperature insulation materials, such as woven glass, zirconium oxide molded components, sodium silicate molded components, graphite components or other suitable materials that have good insulating properties and will not generate particles which can affect sheet yield.

Feed Material Deposition Process

Figure 13A:
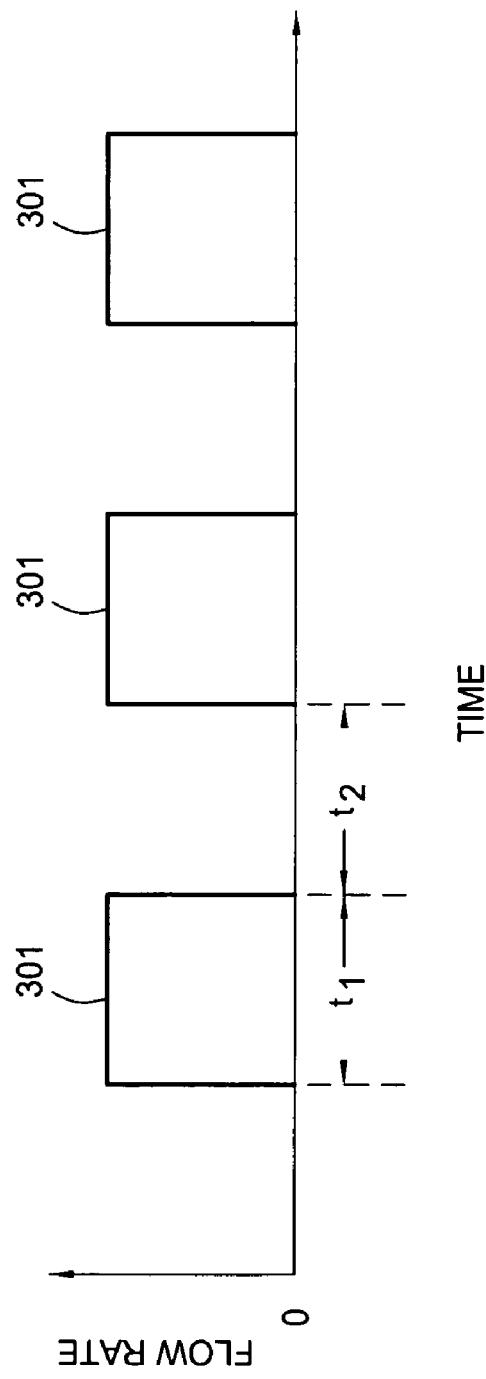
FIG. 13A illustrates a series of rectangular shaped gas flow pulses as a function of time.
Figure 13B:
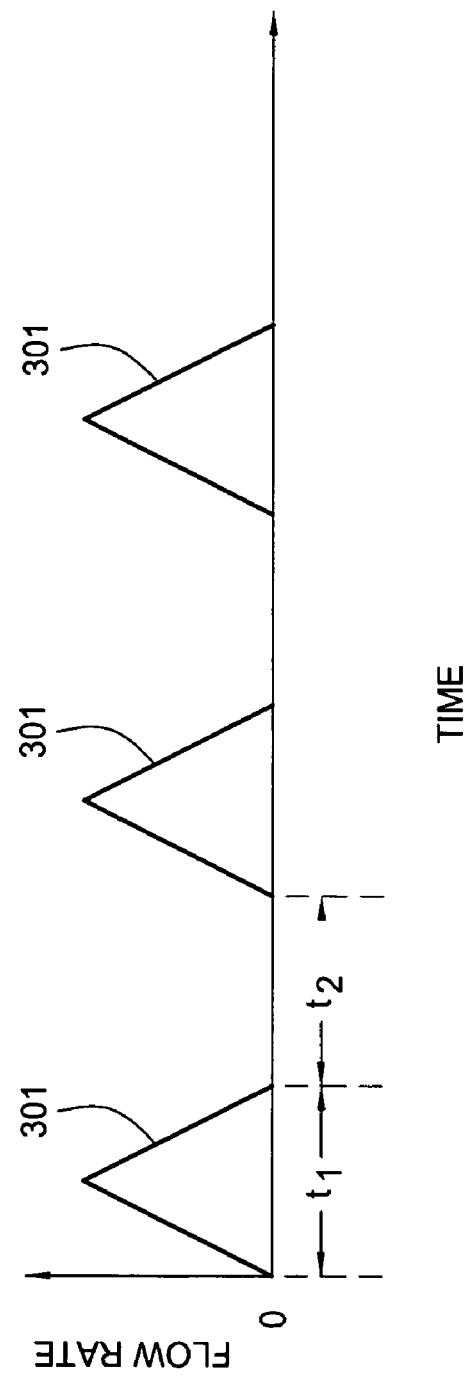
FIG. 13B illustrates a series of triangular shaped gas flow pulses as a function of time.

An example of a deposition process that can be performed using the deposition chamber 130 and material loading module 17 may include the following steps. First, an amount of feed material is loaded in the load region 17H of the material loading module 17A through the lid 17C. The lid 17C is then closed and sealed against the wall 17G of the material loading module 17A (see FIGS. 4 and 4A). In one aspect, the load region 17H is then evacuated by a conventional vacuum pump (not shown) to remove any contaminants and reduce the pressure differential between the load region 17H and the delivery region 17J, which is in communication with the system processing region 15, is generally equal. The doors 17F are then repositioned by use of one or more conventional electromechanical/mechanical actuator (not shown)(e.g., an air cylinder, lead-screw connected to a DC servo motor) to expose the holes 17I formed in the isolation wall 17E so that the feed material can fall into the delivery region 17J of the material loading module 17. The feed material (item "F" FIG. 5) is then channeled to the feed material loading region 142 of the crucible 140 through a plurality of delivery ports 152 formed in the base of the delivery assembly 17B that allow communication between the delivery region 17J and the feed material loading region 142, and eventually the processing region 143. The delivery ports 152 are thus formed by a crucible insulation port 172 and a crucible lid port 181A. The feed material is then heated in the loading region 142 by the heated walls of the crucible 140 due to heat delivered from the crucible heating assembly 191. In one aspect, once the feed material is in a liquid state (hereafter liquid feed material (item "L" in FIG. 8)), the liquid feed material then flows due to gravity into the processing region 143 through the channels 148 (FIG. 7) formed in the inner wall 147 of the crucible 140. The liquid feed material then flows around and fills the processing region 143 and flows into the plurality of deposition ports 141 formed in the crucible base 144. In one aspect, the ports are sized to prevent the liquid feed material from flowing through the deposition ports 141 due to the effect of gravity and the head pressure formed from the liquid feed material positioned above the deposition port 141 (see item "X" in FIG. 8). Therefore, the size of the deposition ports 141 are selected by knowing the surface tension properties of the liquid feed material at the crucible processing temperature. For example, the surface tension of silicon at about 1420° C. is about ten times greater than water at room temperature (e.g., approximately 720 dynes/cm). In one aspect, the size of the deposition ports 141 are between about 0.1 mm and about 3 mm in diameter. Referring to FIG. 8, finally, the liquid feed material is then pushed through the deposition ports 141 by a gas delivered through the delivery ports 201 formed in the injection plate 200 (FIG. 5) so that the liquid feed material is deposited in the collection region 41A of the sheet support platen 41 of the sheet support assembly 40. The deposited feed material in the collection region 41A of the sheet support platen 41 will be described hereafter as the "solidified cluster" (item "A"), since the temperature at which the sheet support platen 41 is maintained is generally below the solidification temperature of the liquid feed material. In one embodiment, the flow characteristics and timing of the flow of gas through the delivery ports 201, which pushes the liquid feed material through the deposition ports 141, is controlled by use of the controller 101. The flow of gas may be a continuous flow of gas, a continuous flow of varying amounts of gas, or more preferably a series of pulses of gas, or gas pulses 301, that are controlled by the valves 163 and the controller 101. The magnitude of the gas flow rate during each of the gas pulses 301, the duration of each of the gas pulses (e.g., element $t_1$ in FIGS. 13A-13B), and the time between the gas pulses (e.g., element $t_2$ in FIGS. 13A-13B) may be controlled by use of the controller 101 and the one or more valves 163. FIG. 13A illustrates a series of gas pulses 301 that have a constant flow during the duration of the gas pulse 301 delivered to the one or more of the delivery ports 201. FIG. 13B illustrates an example of a series of gas pulses 301 that may have a varying flow rate of gas delivered through the one or more of the delivery ports 201 during the duration of a gas pulse 301. In one aspect, a plurality of needle valves (not shown), pressure regulators (not shown), and/or mass flow controllers (not shown) may be used in conjunction with the controller 101 and valves 163 to control the flow rate and/or duration of gas delivered through the one or more of the delivery ports 201. In one aspect, the sequence of gas pulses delivered to each of the delivery ports 201 is synchronized by use of the controller 101 and the robot transferring device 21 to deliver a desired pattern of solidified clusters on to the support platen 41, which is further described below (FIGS. 10A-10D).

FIG. 9 illustrates a plan view of the collection region 41A on which two solidified drops "A" have been deposited. It is believed that if the temperature of the sheet support platen 41 is maintained below about 1220° C. the silicon solidified drops (item "A") will formed from a plurality of smaller crystallites "B", each having there own crystal structure (i.e., amorphous structure or a crystalline structure). By adjusting the sheet support platen 41 temperature relative to the melting point temperature of the feed material, the size of the crystallites and crystal structure of each of the crystallites may be tailored as desired. In one aspect, it may also be desirable to adjust the surface finish or use a certain type of interfacial materials between the deposited material and the collection region 41A, such as silicon (Si) or SiN to obtain a preferred orientation of the deposited material crystallites and/or solidified drops sheet support platen 41.

Sheet Formation Process.

Figure 10A:
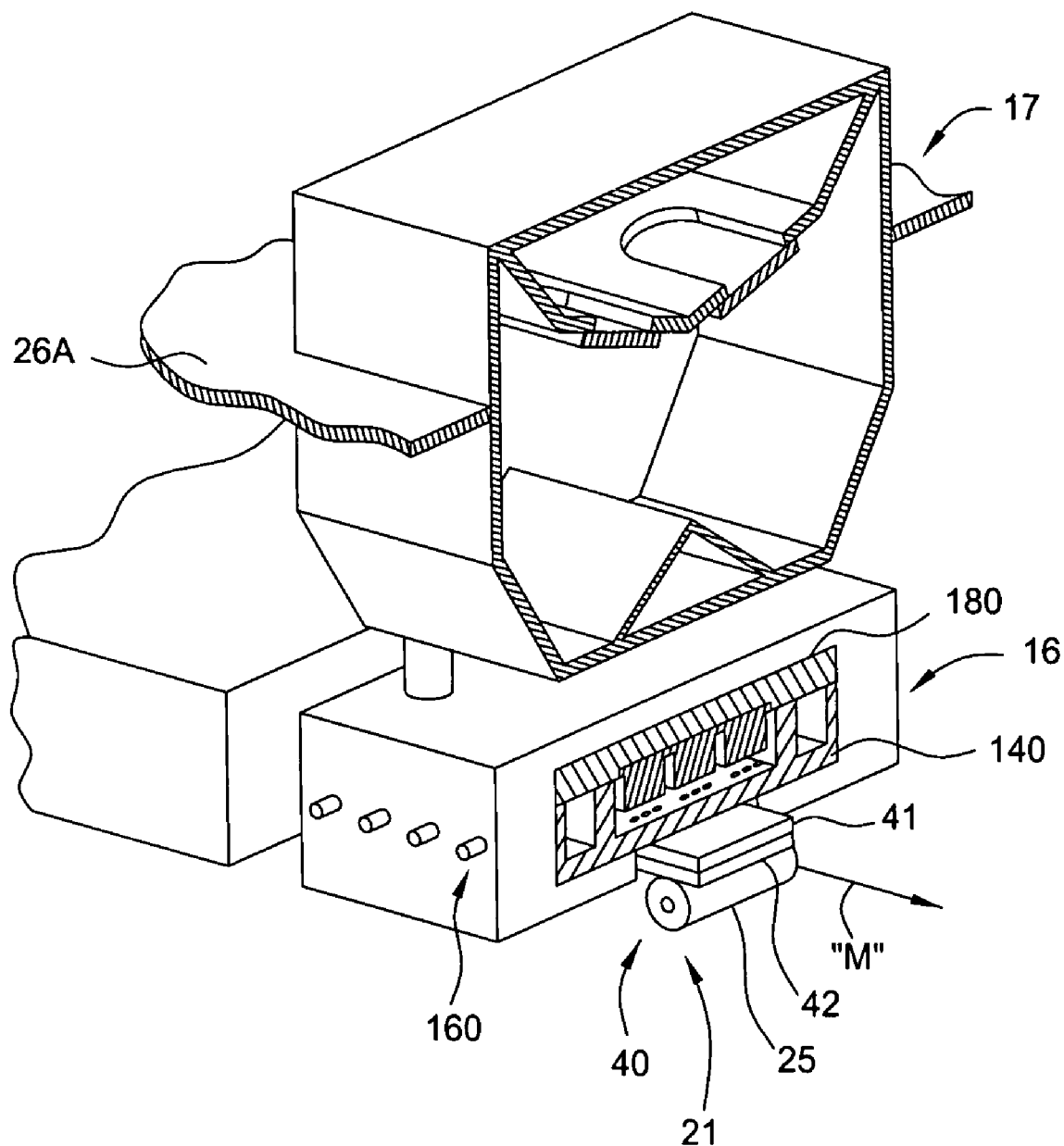
FIG. 10A is an isometric cross-sectional view of the of the deposition reactor illustrated in FIG. 4A in accordance with embodiments of the invention.
Figure 10B:
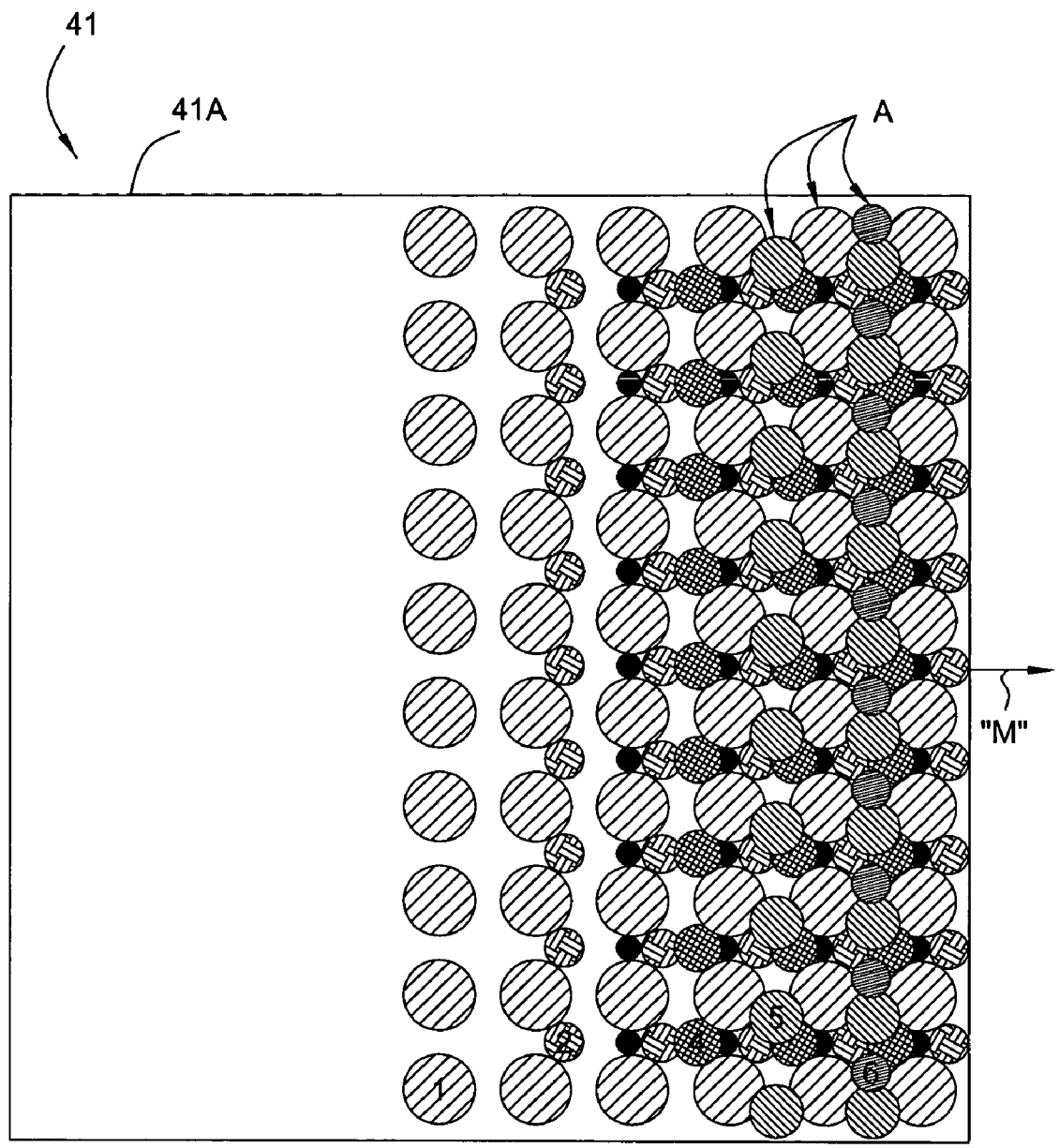
FIG. 10B is a plan view of an array of solidified drops deposited on the collection region of the sheet support assembly in accordance with embodiments of the invention.

FIG. 10A is an isometric cross-sectional view of the deposition chamber 130 and material loading module 17 which illustrates the movement (item "M") of the sheet support assembly 40 relative to the deposition chamber 130 due to the interaction of the sheet support elements 42 interaction with the process level conveyor 22. Referring to FIG. 10A, in one case the movement direction is aligned with the X-direction. FIGS. 10A-10C are intended to illustrate the outcome of completing the deposition process, described above, a number of times to form a layer or layers of the solidified drops on the collection region 41A. In this configuration the position and speed of the sheet support assembly 40 relative to the deposition chamber 130 is controlled by use of the controller 101 and the conveyor actuator (not shown) contained in the process level conveyor 22. In one aspect, the speed with which the sheet support assembly 40 is transferred through the deposition chamber 130 is controlled between about 0.1 meters/minute and about 4.0 meters/minute, and more preferably between about 2.0 meters/minute and about 4.0 meters/minute.

FIG. 10B is a plan view of the collection region 41A of the sheet support platen 41 that are intended to illustrate the process of forming a sheet by successively depositing the solidified drops on the collection region 41A. FIG. 10C is a plan view of the collection region 41A of the sheet support platen 41 illustrating the collection region 41A after it has been completely covered with solidified drops.

Referring to FIG. 7 and FIG. 10B, in one embodiment of the deposition chamber 130 the deposition ports 141 and companion delivery ports 201 are staggered and/or positioned so that an array of solidified drops can be deposited across the sheet support platen 41 (e.g., X and Y directions in FIG. 10A) as the sheet support 40 is transferred by the process level conveyor 22 to form a deposited layer(s) that has a relatively homogeneous cross-sectional thickness (FIG. 10D; Z direction in FIG. 10A). By adjusting the size of the deposition ports 141, the flow rate of the gas delivered through the delivery ports 201, and/or the duration of a gas pulse, the size of the solidified drops can be tailored to assure uniform coverage of the collection region 41A and a uniform thickness of the final deposited layer. In one aspect, the thickness of a sheet deposited using this process may be between about 150 and about 350 micrometers (μm). Therefore, in one aspect of the invention, the size of the solidified drops (element "A" in FIG. 9) is controlled to tailor the final grain size of the sheet formed using this process. In one aspect the solidified drops may vary in size from about 10 micrometers (μm) and about 100 μm, and more preferably between about 50 μm and about 100 μm. The deposition process thus described herein breaks the relationship commonly found in ribbon sheet fabrication processes between the final grain size of the polycrystalline solidified sheet and the particle size of the powder from which the sheet was formed. In many SSP prior art references a direct correlation has been found between the achieved grain size in the sheet and the granularity (e.g., particle size) of the powder directly used to form the sheet, which may be undesirable in some cases. Therefore, one advantage of the invention described herein is fact that the need to tightly control the feed material's powder particle size is thus greatly reduced by use of the embodiments described herein, which can reduce the feed material cost and CoO the processing system 10.

Another advantage of the deposition process(es) described herein is that the process of depositing the feed material from a liquid will reduce the amount of the silicon dioxide incorporation in the formed sheet, due to the reduced need for small particle size silicon powders which have a high surface area that has been naturally oxidized. Silicon oxides (e.g., $SiO_2$) are a source of contamination in the formed sheet that naturally occur at all exposed silicon surfaces and thus are a common contaminant found in powder processing. The reduced need for small particle size silicon powders will reduce the incorporation of the oxides in the sheet due to reduced surface area of the powders and thus the amount of $SiO_2$ in the deposition reactor 130. Also, the use of an inert environment that surrounds the deposition reactor 130 will also reduce the oxygen incorporation into the liquid feed material during processing. It is believed that prior art applications, such as SSP applications, that form sheets directly from granular powders have a much higher probability of incorporating silicon oxides in the formed sheet due to the rate limited diffusion process required to remove the contaminants out of the melting and solidifying material at the high processing throughputs required to reduce the sheet fabrication cost. Also, this issue becomes more pronounced as the granular particle size is decreased to achieve a desired grain size in the sheet, due to the increase in surface area and thus the amount of oxides that need to be removed from the melting and solidifying material during the sheet forming process. Also, the need to flow a reducing type of gas, such as hydrogen, in the conventional granular particle sheet forming process may not be required, which will reduce the CoO of the system and system complexity. In some cases instead of using a reducing gas processing step, a "sparging" process step may be performed on the feed material to reduce and/or control the amount of carbon and oxygen content in the formed sheet.

Referring to FIGS. 10B-C, in one embodiment many different sized solidified drops (e.g., six sizes shown) are arranged perpendicular to the transfer direction (X-direction) so that they will overlap to form a continuous layer of deposited material as the sheet support assembly 40 is transferred under the crucible base 144. One advantage of the processes described herein is the reduced need to tightly control the temperature of silicon material during the process of forming the silicon sheet completed during the step 106. The lessened need for tight temperature uniformity control arises, since the sheet forming process does not rely on mass transfer type process, such as conventional "direct casting" type sheet forming processes that grow a sheet from a cold walled sheet. Also, it is believed that due to the size of the deposited solidified drops and the fact that silicon has about a 10% volume expansion during the solidification process the internal stress induced in the sheet during the sheet forming process will be reduced over other conventional processes, such as direct casting.

It is also believed that since the size of the solidified drops can be adjusted to more easily achieve a desired sheet thickness and final columnar grain distribution in the sheet "W" after performing step 108 (e.g., re-crystallization process (discussed below)), the control of the thermal processes (e.g., temperature accuracy, processing time) required to achieve a desired final columnar grain size during the step 108 will be less critical.

FIG. 10C illustrates an array of solidified drops that completely cover the collection region 41A of the sheet support platen 41 after it has passed underneath the processing chamber 130. One advantage of the process described herein is that the thickness of the final processed sheet and surface finish of the sheet will be more repeatable, more uniform and more easily controlled over the conventional SSP sheet forming processes, because the density change of the sheet formed by the deposited solidified drops formed in step 106 will generally be far less than the density change experienced by forming a sheet using a sintering type process used in the SSP processes. Thickness uniformity is important, but surface roughness is created by subsequent process since it affects the collection efficiency of the solar cell when in use. Typically, solar cells require a rough surface, which can then be further textured by a conventional means. FIG. 10D illustrates a cross-sectional view of a region of the sheet support platen 41 that has a number of solidified drops "A" deposited on top of one another to form a layer of the feed material which will form the sheet. The size and shape of the solidified drops is dependent on the difference in temperature between the temperature of the material contacting the collection region 41A and the surface of the collection region 41A.

Preheat and Re-Crystallization Chamber

In one embodiment of the sheet forming process sequence 100, illustrated in FIG. 3, a pre-heat (discussed above) and/or re-crystallization process are completed during the sheet formation process. The pre-heat process is completed on the sheet support assembly 40 prior to performing the step 106 described in FIG. 3. The re-crystallization process is completed on the layer or layers of solidified drops deposited on the sheet support platen 41 during the deposit silicon layer step (step 106) illustrated in FIG. 3. The re-crystallization process is used to form a sheet that has a columnar grain structure that has a flat and relatively smooth surfaces, a low internal residual stress, a minority carrier diffusion length greater than 40 micrometers, and a minimum grain dimension at least two times the minority carrier diffusion length.

Figure 11:
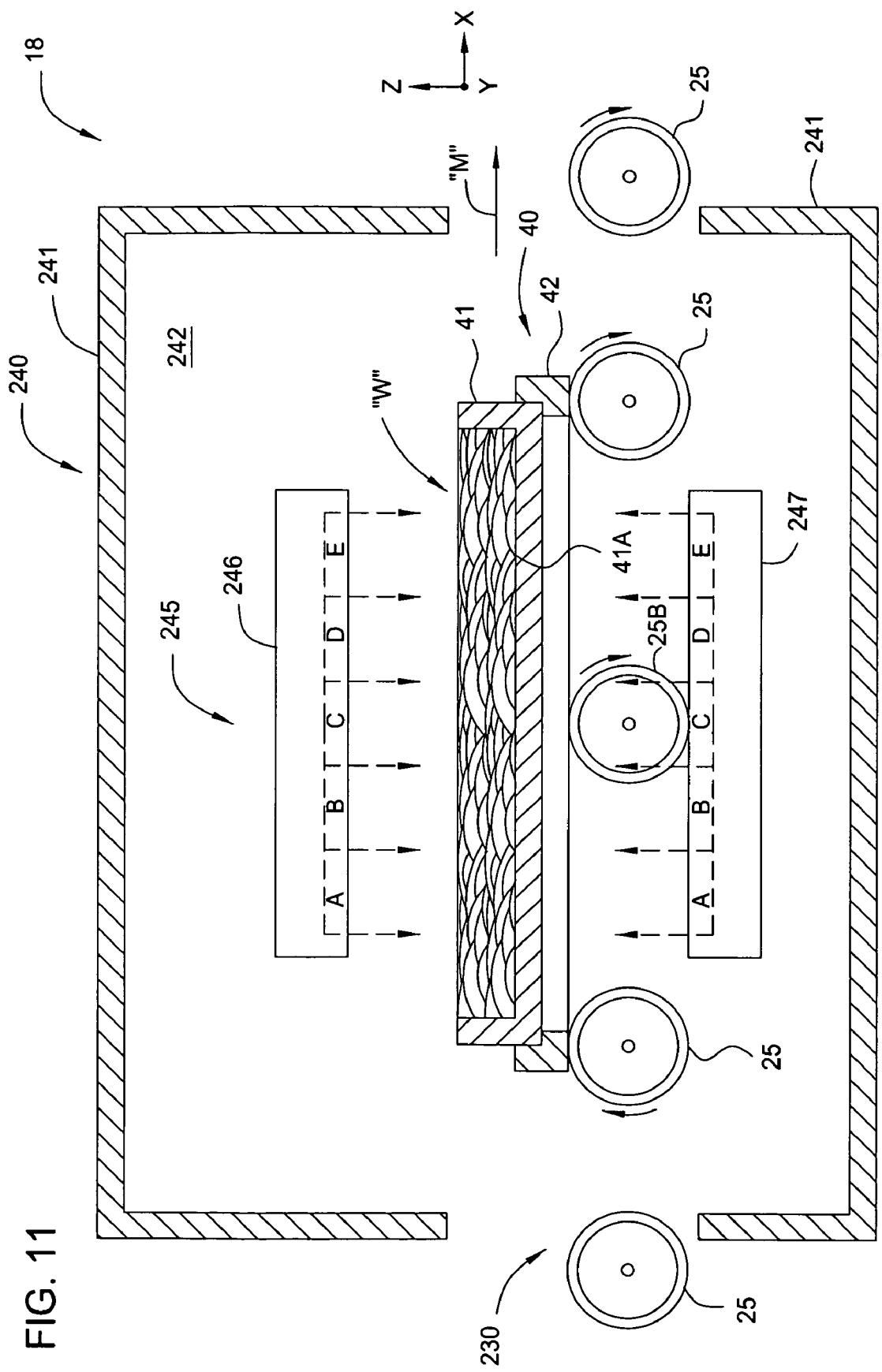
FIG. 11 is a side cross-sectional view of re-crystallization and/or preheat chamber in accordance with embodiments of the invention.

FIG. 11 illustrates one embodiment of a preheat chamber 14 and/or re-crystallization chamber 18 that may be used to perform the preheat or re-crystallization process. While the chamber description below discusses its use as a re-crystallization chamber 18 one skilled in the art will appreciate that the various embodiments discussed below may also be used to perform the process of preheating the sheet support platen 41 to a relatively uniform temperature as the sheet support assembly 40 is transferred through the preheat chamber 14 by use of the robot transferring device 21 during the process step 104 (FIG. 3).

The re-crystallization process (step 108) is performed on the layer or layers of solidified drops deposited on the sheet support platen 41. In general, the re-crystallization process is performed on only one region, or on all of the deposited material on the sheet support platen at a time, to cause the material to form a sheet having a columnar grain structure having a grain size that is between about 80 µm and about 500 µm and is oriented generally perpendicular to the processing surface 41A of the sheet support platen 41. In general, the re-crystallization chamber 18 will contain a heating source 245, an enclosure 240 and a transferring mechanism 230. The enclosure 240 generally contains one or more walls 241 that enclose the re-crystallization chamber processing region 242 and are adapted to minimize the heat transfer between the re-crystallization chamber 18 and the other components in the system processing region 15 or vice versa. In one aspect, the walls are formed from or contain an insulating material such as woven glass, zirconium oxide molded components, sodium silicate molded components, graphite components or other suitable materials that have good insulating properties and will not generate particles which can affect sheet yield.

In one embodiment of the re-crystallization chamber 18, the heating source 245 has an upper heating source 246 and a lower heating source 247 that are adapted to transfer energy to the layer or layers of solidified drops deposited on the sheet support platen 41. In one aspect, the upper heating source 246 and the lower heating source 247 contain multiple zones (elements A-E) of radiant lamps that are adapted to radiantly heat the solidified drops to form the a sheet that has a desired crystalline structure. In another aspect, the upper heating source 246 and the lower heating source 247 form, or contain, one or more inductive heating sources commonly used in zone refining processes. Typically the inductive heating sources are RF powered coils which transfer radiant heat to the surface of the layer or layers of solidified drops deposited on the sheet support platen 41. In this configuration, by use of one or more heating zones formed in the upper heating source 246 and/or the lower heating source 247, a region of the layer or layers of solidified drops can be pre-heated if necessary by one zone, then heated to a re-crystallization or re-melting temperature by another zone, and then slowly cooled, or annealed, by yet another zone. In one aspect, the upper heating source 246 and the lower heating source 247 are adapted to deliver different amounts of energy to the sheet support platen 41 to form a temperature gradient across the layer or layers of solidified drops to control the re-crystallization process.

In another aspect of the re-crystallization chamber 18, the sheet support platen 41 is positioned between the upper heating source 246 and the lower heating source 247 and then heated all at once to deliver a uniform temperature profile across the layer or layers of solidified drops deposited on the sheet support platen 41 (e.g., X and Y direction in FIG. 11). In one aspect, the multiple zones in the upper heating source 246 and/or the lower heating source 247 are used to deliver a uniform temperature profile across the sheet support platen 41 as the sheet "W" is heated all at one time.

In one embodiment, the transferring mechanism 230, which is a subcomponent of the process level conveyor 22, contains a plurality of rollers 25 that are adapted to transfer the sheet support assembly 40 through the re-crystallization chamber 18. FIG. 11 is a side cross-sectional view that illustrates the transferring mechanism 230 moving the sheet support assembly 40 in a direction "M" due to the rotation of the various rollers 25. In one aspect of the transferring mechanism 230, one or more of the rollers (elements 25B) are sized such that they only support the outer edge of the support element 42 so that it will not obscure the lower heating source 247's view of sheet support platen 41.

Cool Down Chamber

Referring to FIG. 12 illustrates one embodiment of a cool down chamber 20 that may be used to cool the sheet support after depositing a layer or layers of solidified drops on the sheet support platen 41 and/or performing the re-crystallization process.

In general, the cool down process is performed on the deposited material on the sheet support platen 41 to cause the material to cool to a temperature between about 100° C. and about 650° C. In general, the cool down chamber 20 will contain a cooling source 345, an enclosure 340 and a transferring mechanism 230. The enclosure 340 generally contains one or more walls 341 that enclose the cool down chamber processing region 342 and isolate it from the other chambers in the system processing region 15. In one aspect, the walls are formed from or contain an insulating material such as woven glass, zirconium oxide molded components, sodium silicate molded components, graphite components or other suitable materials that have good insulating properties and will not generate particles which can affect sheet yield.

In one embodiment of the cool down chamber 20, the cooling source 345 has an upper cooling source 346 and a lower cooling source 347 that are adapted to receive the energy from sheet support assembly 40 as it passes through the cool down chamber processing region 342. In one aspect, the upper cooling source 346 and the lower cooling source 347 contain multiple channels (e.g., elements 348 and 349) formed in each sources that are adapted to receive a heat exchanging fluid to cool the sources (e.g., elements 346 and 347) and remove the heat radiated to them from the sheet support assembly 40. In this configuration, by use of the cooling channels formed in the upper cooling source 346 and/or the lower cooling source 347, the layer or layers of solidified drops can be cooled slowly, or fast depending the speed with which the sheet support 40 is transferred through the processing region 342 of the cool down chamber 20. In one aspect, the heat exchanging fluid may be, for example, a perfluoropolyether (e.g., Galden®) that is temperature controlled to a temperature between about 5° C. and about 20° C. The heat exchanging fluid may also be chilled water or a temperature controlled gas, such as argon or nitrogen.

In another aspect of the cool down chamber 20, the sheet support platen 41 is positioned between the upper cooling source 346 and the lower cooling source 347 and then cooled all at once so that the cooling profile across the layer or layers of solidified drops deposited on the sheet support platen 41 (e.g., X and Y direction in FIG. 11) is uniform across the formed sheet surface as it is cooled. In one aspect, the multiple channels in the upper cooling source 346 and/or the lower cooling source 347 are used to deliver a uniform cooling profile across the sheet support platen 41.

In one embodiment, the transferring mechanism 230, which is a subcomponent of the process level conveyor 22, contains a plurality of rollers 25 that are adapted to transfer the sheet support assembly 40 through the cool down chamber 20. FIG. 12 is a side cross-sectional view that illustrates the transferring mechanism 230 moving the sheet support assembly 40 in a direction "M" due to the rotation of the various rollers 25. In one aspect of the transferring mechanism 230, one or more of the rollers (elements 25B) are sized such that they only support the outer edge of the support element 42 so that it will not obscure the lower cooling source 347's view of sheet support platen 41.

While the foregoing is directed to embodiments of the present invention, other and further embodiments of the invention may be devised without departing from the basic scope thereof, and the scope thereof is determined by the claims that follow.

The invention claimed is:

1. An apparatus for forming a polycrystalline semiconductor sheet comprising:
   a deposition reactor comprising:
      a crucible having an outer wall, a base, and a lid that form a crucible processing region and a deposition port that is formed in the base, wherein the deposition port is in fluid communication with the crucible processing region;
      a heater in thermal communication with the crucible, wherein the heater is adapted to heat a feed material positioned in the crucible processing region to a liquid state; and
      a gas delivery port that is in fluid communication with a fluid source, the feed material positioned in the crucible processing region, and the deposition port; and
   a sheet support platen having a collection region that is positioned adjacent the base to receive feed material delivered through the deposition port from the crucible processing region, wherein a surface of the collection region of the sheet support platen comprises a material selected from the group consisting of silicon carbide, silicon nitride, boron nitride, graphite, and boron carbide.

2. An apparatus for forming a polycrystalline semiconductor sheet comprising:
   a deposition reactor comprising:
      a crucible having an outer wall, a base, and a lid that form a crucible processing region and a plurality of deposition ports that are formed in the base, wherein the deposition ports are in fluid communication with the crucible processing region;
      a heater in thermal communication with the crucible, wherein the heater is adapted to heat a feed material positioned in the crucible processing region to a liquid state; and
      a plurality of gas delivery ports that are in fluid communication with one or more fluid sources, the feed material positioned in the crucible processing region, and the plurality of deposition ports, wherein at least one gas delivery port is in fluid communication with each of the deposition ports;
   a sheet support platen having a collection region that is positioned adjacent the base to receive feed material delivered through the deposition ports from the crucible processing region, wherein a surface of the collection region of the sheet support platen comprises a material selected from the group consisting of silicon carbide, silicon nitride, boron nitride, graphite, and boron carbide; and
   an actuator adapted to position the sheet support platen beneath the deposition ports and substantially parallel to the base.

3. An apparatus for forming a polycrystalline semiconductor sheet comprising:
   one or more walls that form a system processing region;
   a deposition reactor positioned in the system processing region, wherein the deposition reactor comprises:
      a crucible having an outer wall, a base, and a lid that form a crucible processing region and a deposition port that is formed in the base, wherein the deposition port is in fluid communication with the crucible processing region; and a heater in thermal communication with the crucible, wherein the heater is adapted to heat a feed material positioned in the crucible processing region to a liquid state;

a sheet support platen positioned in the system processing region and having a collection region that is positioned adjacent the base to receive feed material delivered through the deposition port form the crucible processing region;

a re-crystallization chamber positioned in the system processing region and having a re-crystallization processing region, wherein the re-crystallization chamber has a heater and is adapted to heat at least a portion of the feed material deposited on the collection region of the sheet support platen to a desired temperature;

an actuator that is adapted to position the sheet support platen beneath the deposition ports and substantially parallel to the base and to transfer the sheet support platen through the re-crystallization processing region; and a load-lock chamber that is in transferable communication with the system processing region and is adapted to receive a semiconductor sheet formed on the collection region of the support platen.

* * * * *

UNITED STATES PATENT AND TRADEMARK OFFICE
CERTIFICATE OF CORRECTION

PATENT NO. : 7,572,334 B2  
APPLICATION NO. : 11/325089  
DATED : August 11, 2009  
INVENTOR(S) : Kholodenko et al.

Page 1 of 1

It is certified that error appears in the above-identified patent and that said Letters Patent is hereby corrected as shown below:

In the References Cited (56):

Please delete "4,578,144 A 3/1986 Hiramoto" and insert --4,578,143 A 3/1986 Arai-- therefor;

Please delete "5,842,462 A 6/1989 Tildesley" and insert --5,842,462 A 12/1998 Schmid et al.-- therefor;

Please delete "JP 2001-151505 6/2006" and insert --JP 2001-151505 6/2001-- therefor.

Signed and Sealed this

Sixth Day of October, 2009

David J. Kappos
*Director of the United States Patent and Trademark Office*